(12) United States Patent
Shih

(10) Patent No.: US 11,765,882 B2
(45) Date of Patent: Sep. 19, 2023

(54) METHOD FOR FABRICATING SEMICONDUCTOR DEVICE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 15 days.

(21) Appl. No.: 17/520,519

(22) Filed: Nov. 5, 2021

(65) Prior Publication Data
US 2022/0059542 A1    Feb. 24, 2022

Related U.S. Application Data

(62) Division of application No. 16/702,884, filed on Dec. 4, 2019, now Pat. No. 11,309,312.

(51) Int. Cl.
*H01L 21/76* (2006.01)
*H10B 12/00* (2023.01)
*G11C 5/06* (2006.01)
*H10B 43/27* (2023.01)
*H10B 43/40* (2023.01)

(52) U.S. Cl.
CPC ............ *H10B 12/05* (2023.02); *G11C 5/063* (2013.01); *H10B 12/0335* (2023.02); *H10B 12/09* (2023.02); *H10B 12/31* (2023.02); *H10B 12/482* (2023.02); *H10B 12/485* (2023.02); *H10B 12/488* (2023.02); *H10B 12/50* (2023.02); *H10B 43/27* (2023.02); *H10B 43/40* (2023.02)

(58) Field of Classification Search
CPC .... H10B 12/31; H10B 12/0335; H10B 12/05; H10B 12/09; H10B 12/482; H10B 12/485; H10B 12/488; H10B 12/50; H10B 43/27; H10B 43/40; H10B 12/053; H10B 12/02; G11C 5/063; H01L 21/764; H01L 27/10808; H01L 27/10897; H01L 27/10855; H01L 27/10885; H01L 27/10888; H01L 27/10891; H01L 27/10873; H01L 27/10876; H01L 27/10894; H01L 27/11582; H01L 27/11573; H01L 27/11526; H01L 27/11556; H01L 27/1052
See application file for complete search history.

(56) References Cited

U.S. PATENT DOCUMENTS

| | | | |
|---|---|---|---|
| 8,595,912 B2 * | 12/2013 | Stubler | E04G 23/0218 52/223.1 |
| 9,305,934 B1 * | 4/2016 | Ding | H10B 43/50 |
| 2009/0212350 A1 * | 8/2009 | Kidoh | H01L 27/105 257/E21.21 |
| 2010/0059731 A1 * | 3/2010 | Chang | H10N 70/8413 438/102 |
| 2012/0070944 A1 * | 3/2012 | Kim | H10B 43/20 257/E21.614 |
| 2019/0363088 A1 * | 11/2019 | Ryu | H01L 29/42336 |

* cited by examiner

*Primary Examiner* — Shouxiang Hu
(74) *Attorney, Agent, or Firm* — Xuan Zhang

(57) ABSTRACT

The present application discloses a method for fabricating a semiconductor device. The method for fabricating a semiconductor device includes providing a substrate comprising a center area and a peripheral area surrounding the center area, forming a first gate stack on the peripheral area and having a top surface, and forming an active column in the center area and having a top surface at a same vertical level as the top surface of the first gate stack.

19 Claims, 40 Drawing Sheets

METHOD FOR FABRICATING SEMICONDUCTOR DEVICE

CROSS-REFERENCE TO RELATED APPLICATION

This application is a divisional application of U.S. Non-Provisional application Ser. No. 16/702,884 filed Dec. 4, 2019, which is incorporated herein by reference in its entirety.

TECHNICAL FIELD

The present disclosure relates to a method for fabricating a semiconductor device, and more particularly, to a method for fabricating a semiconductor device with a flat surface.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing in frequency and impact. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device comprising a substrate including a center area and a peripheral area surrounding the center area, a first gate stack positioned on the peripheral area of the substrate, and an active column positioned in the center area of the substrate. A top surface of the first gate stack and a top surface of the active column are at a same vertical level.

Another aspect of the present disclosure provides a method for fabricating a semiconductor device, including providing a substrate comprising a center area and a peripheral area surrounding the center area, forming a first gate stack on the peripheral area and having a top surface, and forming an active column in the center area and having a top surface at a same vertical level as the top surface of the first gate stack.

Due to the design of the semiconductor device of the present disclosure, the semiconductor device may have a substantially flat top surface. The substantially flat top surface facilitates subsequent semiconductor processes. Therefore, the yield and quality of the semiconductor device may be improved. In addition, the presence of a plurality of air gaps may significantly alleviate an interference effect originating from a parasitic capacitance. Furthermore, the presence of a plurality of epitaxial units may improve a carrier mobility of the semiconductor device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
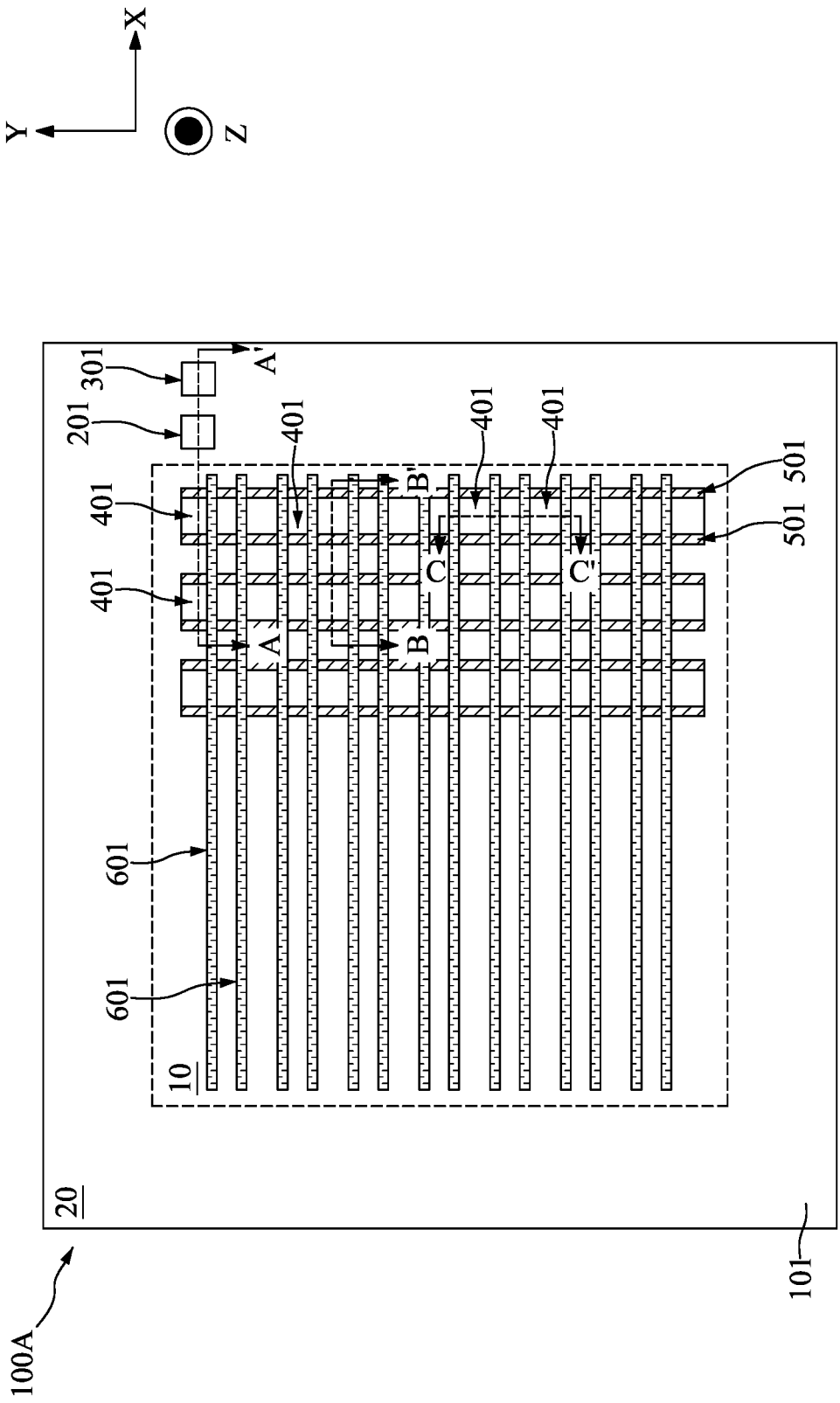
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a memory device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
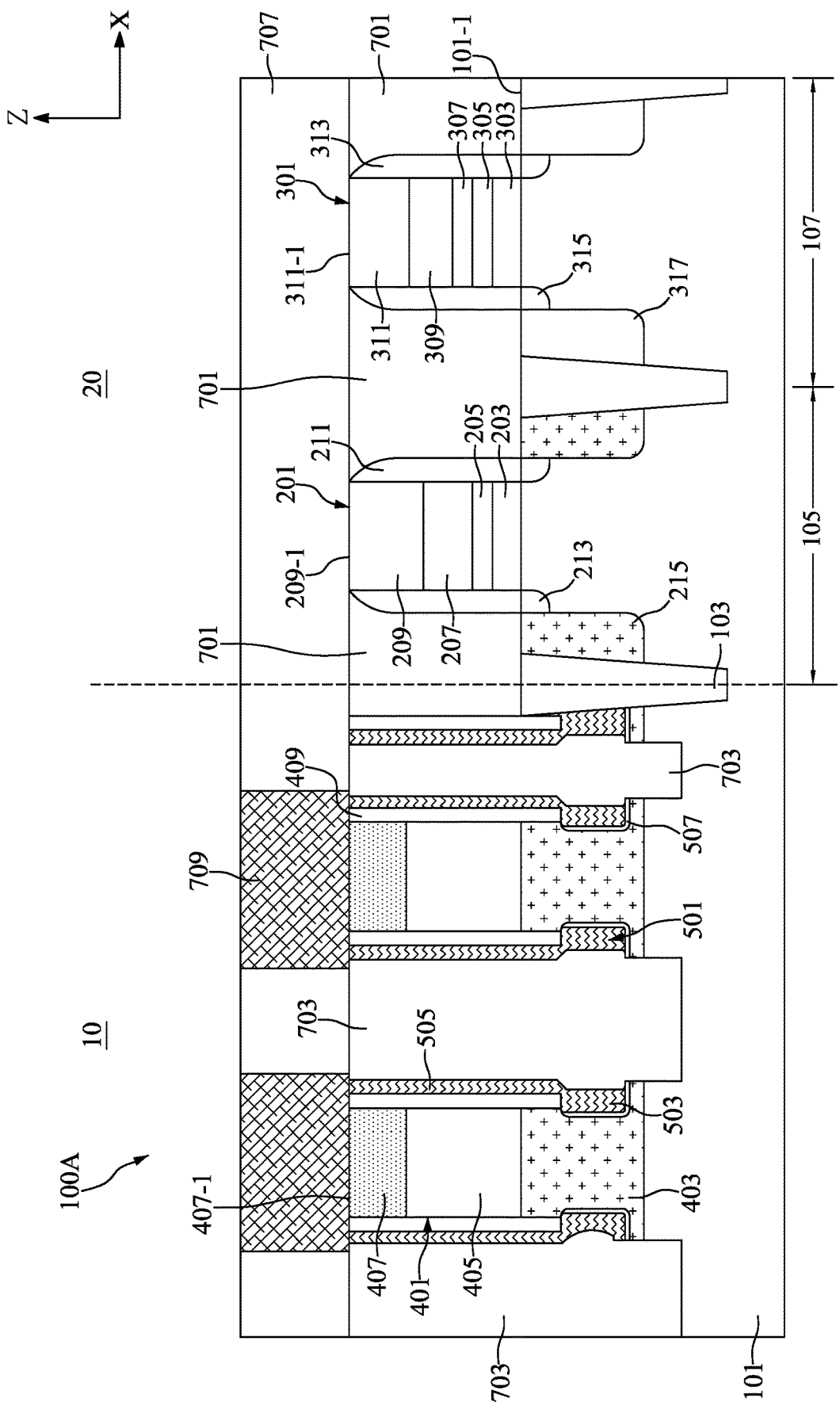
FIG. 2 is a schematic cross-sectional view diagram taken along a line A-A' in FIG. 1.
Figure 3:
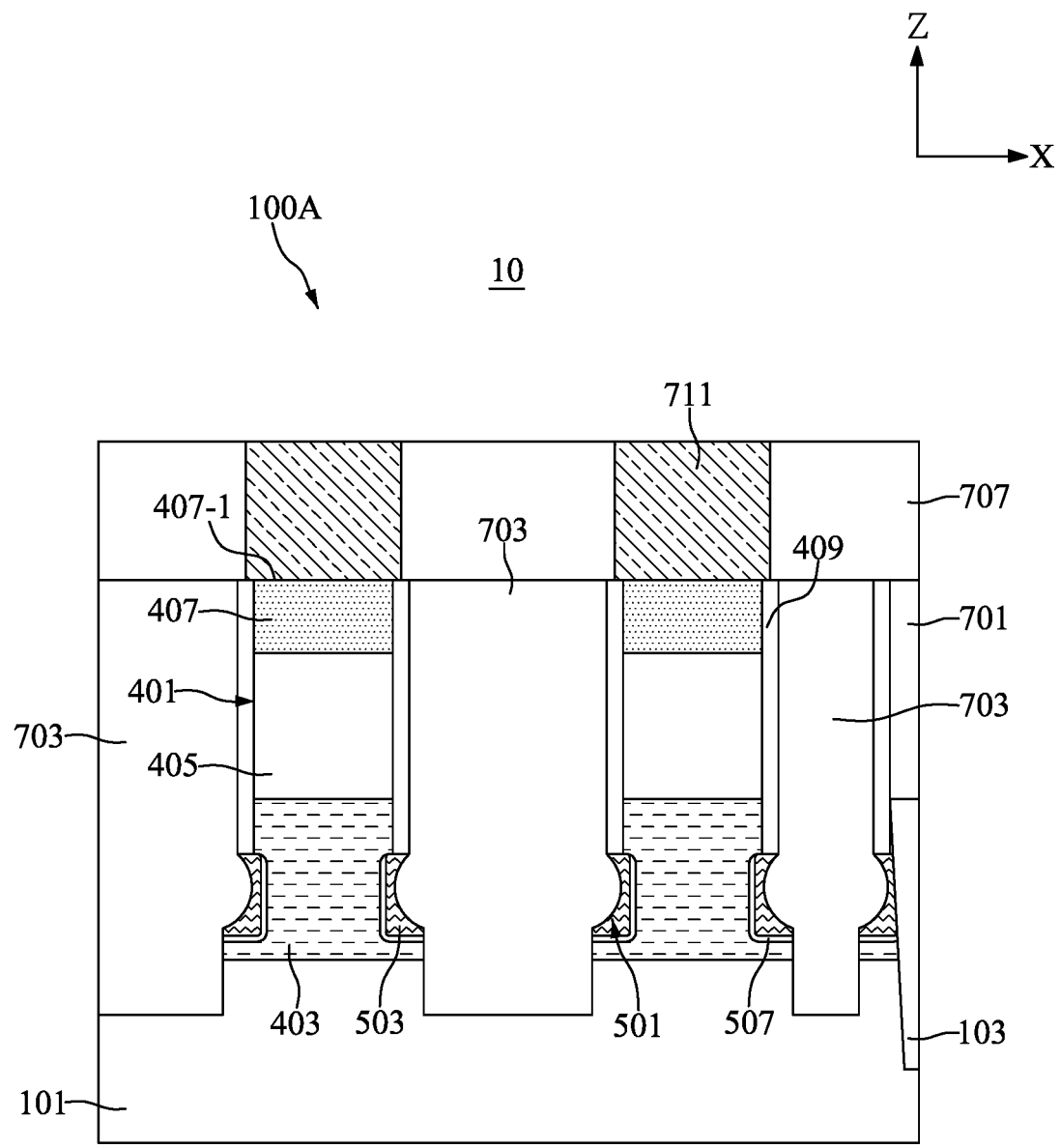
FIG. 3 is a schematic cross-sectional view diagram taken along a line B-B' in FIG. 1.
Figure 4:
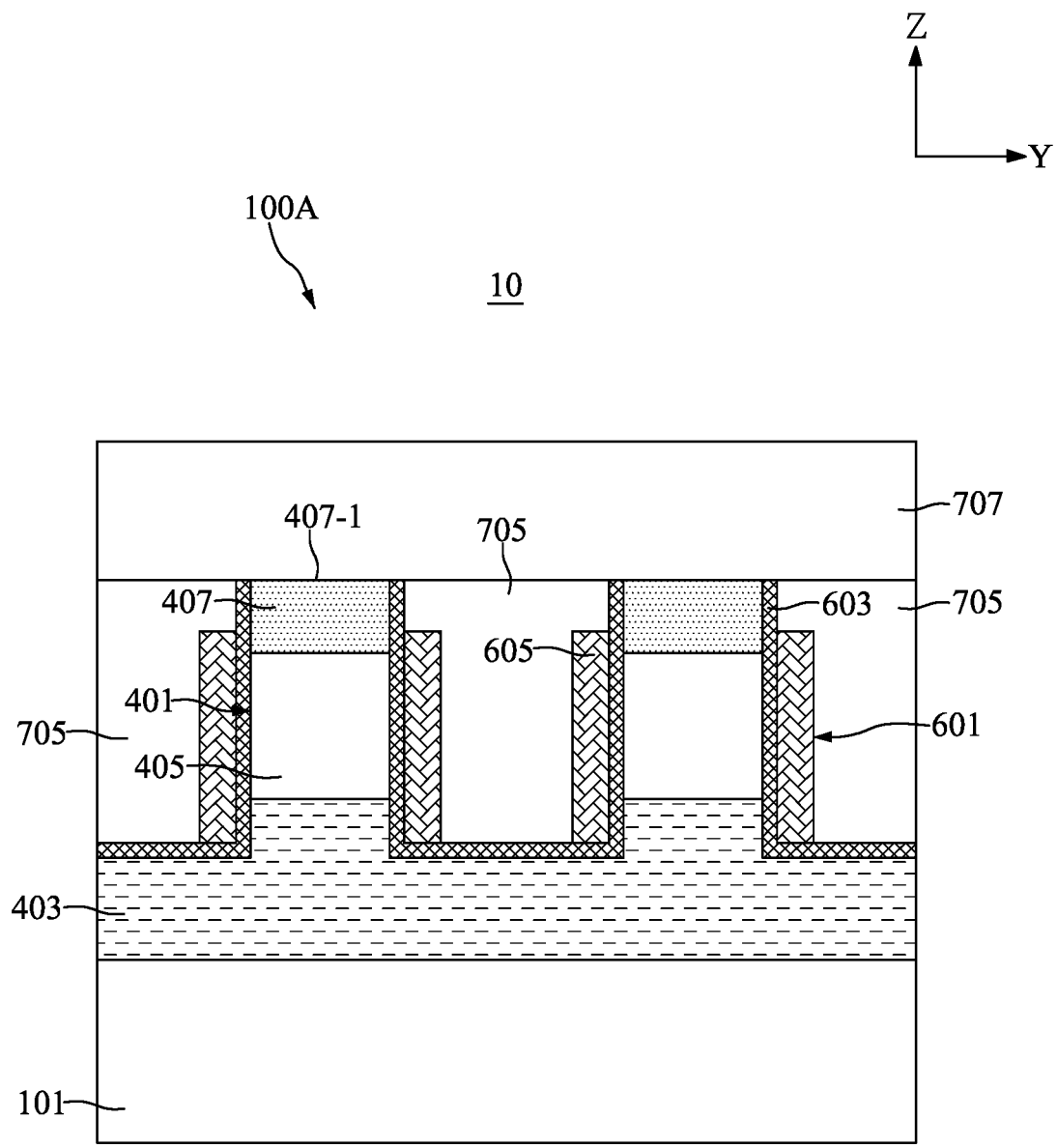
FIG. 4 is a schematic cross-sectional view diagram taken along a line C-C' in FIG. 1.

FIG. 1 illustrates, in a schematic top-view diagram, a semiconductor device 100A in accordance with one embodiment of the present disclosure. FIG. 2 is a schematic cross-sectional view diagram taken along a line A-A' in FIG. 1. FIG. 3 is a schematic cross-sectional view diagram taken along a line B-B' in FIG. 1. FIG. 4 is a schematic cross-sectional view diagram taken along a line C-C' in FIG. 1. Some elements of the semiconductor device 100A of the present disclosure are not shown in FIG. 1 for clarity.

With reference to FIGS. 1 to 4, in the embodiment depicted, the semiconductor device 100A may include a substrate 101, an isolation layer 103, a first gate stack 201, a pair of first gate spacers 211, a pair of first gate lightly-doped regions 213, a pair of first gate heavily-doped regions 215, a second gate stack 301, a pair of second gate spacers 313, a pair of second gate lightly-doped regions 315, a pair of second gate heavily-doped regions 317, a plurality of active columns 401, a plurality of bit lines 501, a plurality of word lines 601, a first insulating layer 701, a second insulating layer 703, a third insulating layer 705, a fourth insulating layer 707, a plurality of bit line contacts 709, and a plurality of capacitor contacts 711.

With reference to FIGS. 1 to 4, in the embodiment depicted, the substrate 101 may include a center area 10 and a peripheral area 20. The peripheral area 20 may surround the center area 10. The substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor material.

It should be noted that the center area 10 may comprise a portion of the substrate 101 and a space above the portion of the substrate 101. From a cross-sectional view perspective, describing an element as being disposed on the center area 10 means that the element is disposed on a top surface of the portion of the substrate 101. Describing an element as being disposed in the center area 10 means that the element is disposed in the portion of the substrate 101; however, a top surface of the element may be even with the top surface of the portion of the substrate 101. Describing an element as being disposed above the center area 10 means that the element is disposed above the top surface of the portion of the substrate 101. From a top-view perspective, describing an element as being disposed in the center area 10 means that the element is disposed within a boundary of the center area 10. The element may be disposed in the portion of the substrate 101, on the top surface of the portion of the substrate 101, or above the top surface of the portion of the substrate 101. Accordingly, the peripheral area 20 may comprise another portion of the substrate 101 and a space above the other portion of the substrate 101.

With reference to FIGS. 1 and 2, in the embodiment depicted, the isolation layer 103 may be disposed in the substrate 101. The isolation layer 103 may be formed of, for example, an insulating material such as silicon oxide, silicon nitride, silicon oxynitride, silicon nitride oxide, or fluoride-doped silicate. The isolation layer 103 may define a first active area 105 and a second active area 107. The first active area 105 and the second active area 107 may be disposed in the peripheral area 20. The second active area 107 may be disposed next to the first active area 105, but is not limited thereto.

With reference to FIGS. 1 and 2, in the embodiment depicted, the first gate stack 201 and the second gate stack 301 may be disposed on a top surface 101-1 of the substrate 101. Specifically, the first gate stack 201 and the second gate stack 301 may be disposed on the peripheral area 20. The first gate stack 201 may intersect a portion of the first active area 105 from a top-view perspective. In other words, the first gate stack 201 may be disposed on the first active area 105. The second gate stack 301 may intersect a portion of the second active area 107 from a top-view perspective. In other words, the second gate stack 301 may be disposed on the second active area 107. The first gate stack 201 may have a top surface at a same vertical level as a top surface of the second gate stack 301.

With reference to FIGS. 1 and 2, in the embodiment depicted, the first gate stack 201 may include a first gate insulating layer 203, a first gate bottom conductive layer 205, a first gate filler layer 207, and a first gate mask layer 209. The first gate insulating layer 203 may be disposed on the peripheral area 20 and on the first active area 105. The first gate insulating layer 203 may have a thickness between about 0.5 nm and about 5.0 nm. Preferably, the thickness of the first gate insulating layer 203 may be between about 0.5 nm and about 2.5 nm.

The first gate insulating layer 203 may be formed of, for example, an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a mixture thereof. Alternatively, in another embodiment, the insulating material may be silicon oxide, silicon nitride, silicon oxynitride, silicon nitride oxide, or the like.

With reference to FIGS. 1 and 2, in the embodiment depicted, the first gate bottom conductive layer 205 may be disposed on the first gate insulating layer 203. The first gate bottom conductive layer 205 may have a thickness between about 10 angstroms and about 200 angstroms. Preferably, the thickness of the first gate bottom conductive layer 205 may be between about 10 angstroms and about 100 angstroms. The first gate bottom conductive layer 205 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. The first gate filler layer 207 may be disposed on the first gate bottom conductive layer 205. The first gate filler layer 207 may be formed of, for example, tungsten or aluminum. The first gate mask layer 209 may be disposed on the first gate filler layer 207 and may be formed of, for example, silicon oxide, silicon nitride, silicon oxynitride, or silicon nitride oxide.

With reference to FIGS. 1 and 2, in the embodiment depicted, the pair of first gate spacers 211 may be disposed on the substrate 101 and respectively correspondingly disposed adjacent to two sides of the first gate stack 201. The pair of first gate spacers 211 may be formed of, for example, silicon oxide, silicon nitride, silicon oxynitride, or silicon nitride oxide. The pair of first gate lightly-doped regions 213 may be disposed in the first active area 105 and respectively correspondingly disposed adjacent to two sides of the first gate insulating layer 203. The pair of first gate heavily-doped regions 215 may be disposed in the first active area 105 and respectively correspondingly disposed next to the pair of first gate lightly-doped regions 213. The pair of first gate lightly-doped regions 213 and the pair of first gate heavily-doped regions 215 may be doped with a dopant such as phosphorus, arsenic, or antimony and have a first electrical type. The pair of first gate heavily-doped regions 215 may have a dopant concentration greater than a dopant concentration of the pair of first gate lightly-doped regions 213.

With reference to FIGS. 1 and 2, in the embodiment depicted, the second gate stack 301 may include a second gate insulating layer 303, a second gate bottom conductive layer 305, a second gate top conductive layer 307, a second gate filler layer 309, and a second gate mask layer 311. The second gate insulating layer 303 may be disposed on the peripheral area 20 and on the second active area 107. The second gate insulating layer 303 may have a same thickness as the first gate insulating layer 203. Alternatively, in another embodiment, the second gate insulating layer 303 may have a thickness different from the first gate insulating layer 203.

The second gate insulating layer 303 may be formed of a same material as the first gate insulating layer 203, but is not limited thereto.

With reference to FIGS. 1 and 2, in the embodiment depicted, the second gate bottom conductive layer 305 may be disposed on the second gate insulating layer 303. The second gate bottom conductive layer 305 may have a thickness between about 10 angstroms and about 100 angstroms. The second gate bottom conductive layer 305 may be formed of, for example, titanium nitride, tantalum nitride, tantalum carbide, tungsten nitride, or ruthenium. The second gate top conductive layer 307 may be disposed on the second gate bottom conductive layer 305. The second gate top conductive layer 307 may have a same thickness as the first gate bottom conductive layer 205, but is not limited thereto. The second gate top conductive layer 307 may be formed of a same material as the first gate bottom conductive layer 205, but is not limited thereto.

With reference to FIGS. 1 and 2, in the embodiment depicted, the second gate filler layer 309 may be disposed on the second gate top conductive layer 307. The second gate filler layer 309 may have a same thickness as the first gate filler layer 207, but is not limited thereto. The second gate filler layer 309 may be formed of a same material as the first gate filler layer 207, but is not limited thereto. The second gate mask layer 311 may be disposed on the second gate filler layer 309. The second gate mask layer 311 may be formed of a same material as the first gate mask layer 209, but is not limited thereto. A top surface 311-1 of the second gate mask layer 311 may be at a same vertical level as a top surface 209-1 of the first gate mask layer 209.

With reference to FIGS. 1 and 2, in the embodiment depicted, the pair of second gate spacers 313 may be disposed on the substrate 101 and respectively correspondingly disposed adjacent to two sides of the second gate stack 301. The pair of second gate spacers 313 may be formed of a same material as the pair of first gate spacers 211, but are not limited thereto. The pair of second gate lightly-doped regions 315 may be disposed in the second active area 107 and respectively correspondingly disposed adjacent to two sides of the second gate insulating layer 303. The pair of second gate heavily-doped regions 317 may be disposed in the second active area 107 and respectively correspondingly disposed next to the pair of second gate lightly-doped regions 315. The pair of second gate lightly-doped regions 315 and the pair of second gate heavily-doped regions 317 may be doped with a dopant such as boron and have a second electrical type. The pair of second gate heavily-doped regions 317 may have a dopant concentration greater than a dopant concentration of the pair of second gate lightly-doped regions 315.

The different thicknesses of the second gate insulating layer 303 and the first gate insulating layer 203 may result in different threshold voltages for the second gate stack 301 and the first gate stack 201. As a result, the first gate stack 201 and the second gate stack 301 may provide different purposes or functions. Therefore, the applicability of the semiconductor device 100A may be increased.

With reference to FIGS. 1 and 2, in the embodiment depicted, the first insulating layer 701 may be disposed on the top surface 101-1 of the substrate 101. Specifically, a main portion of the first insulating layer 701 may be disposed on the peripheral area 20. A minor portion of the first insulating layer 701 may be disposed on an edge of the center area 10. The first insulating layer 701 may cover the first gate stack 201 and the second gate stack 301. A top surface of the first insulating layer 701 may be at a same vertical level as the top surfaces of the first gate stack 201 and the second gate stack 301. The first insulating layer 701 may be formed of, for example, silicon oxide, flowable oxide, undoped silica glass, borosilica glass, phosphosilica glass, borophosphosilica glass, fluoride silicate glass, carbon-doped silicon oxide, organo silicate glass, or a combination thereof, but is not limited thereto.

With reference to FIG. 1, in the embodiment depicted, from a top-view perspective, the plurality of active columns 401 may be disposed in the center area 10 and each of the plurality of active columns 401 may have a rectangular shape. The plurality of active columns 401 may be separated from each other and may be respectively disposed along a direction X and a direction Y. Distances between adjacent pairs of the active columns 401 along the direction X or the direction Y may be the same.

With reference to FIG. 2, in the embodiment depicted, from a cross-sectional view perspective, the plurality of active columns 401 may be columns extending in the direction Z. Any one of the plurality of active columns 401 may include a lower portion and an upper portion. The lower portion of the active column 401 may be disposed in the substrate 101. The upper portion of the active column 401 may be disposed on the substrate 101. Top surfaces of the plurality of active columns 401 may be at a same vertical level as the top surfaces of the first gate stack 201 and the second gate stack 301.

With reference to FIG. 2, in the embodiment depicted, the active columns 401 may include a bottom doped region 403, a channel region 405, a top doped region 407, and a pair of insulating spacers 409. The bottom doped region 403 may be regarded as the lower portion of the active column 401. The channel region 405 and the top doped region 407 may be regarded as the upper portion of the active column 401. The bottom doped region 403 may be disposed in the center area 10. A top surface of the bottom doped region 403 may be at a same vertical level as the top surface 101-1 of the substrate 101. The bottom doped region 403 may be formed of, for example, doped silicon or epitaxy growth silicon with in-situ doping. The bottom doped region 403 may be doped with a dopant such as phosphorus, arsenic, or antimony and may have the first electrical type. A lower portion and an upper portion of the bottom doped region 403 may have a same dopant concentration. Alternatively, in another embodiment, the bottom doped region 403 may have a dopant concentration gradient. For example, the dopant concentration of the lower portion of the bottom doped region 403 may be greater than the dopant concentration of the upper portion of the bottom doped region 403.

With reference to FIG. 2, in the embodiment depicted, the channel region 405 may be disposed on the bottom doped region 403. A bottom of the channel region 405 may be at a same vertical level as the top surface 101-1 of the substrate 101. The channel region 405 may be formed of, for example, doped silicon or epitaxy growth silicon with in-situ doping. The channel region 405 may be doped with a dopant such as boron and may have the second electrical type. The top doped region 407 may be disposed on the channel region 405. A top surface 407-1 of the top doped region 407 may be at a same vertical level as the top surface 209-1 of the first gate mask layer 209 and the top surface 311-1 of the second gate mask layer 311. The top doped region 407 may be formed of, for example, doped silicon or epitaxy growth silicon with in-situ doping. The top doped region 407 may be doped with a dopant such as phosphorus, arsenic, or antimony and may have the first electrical type. Alternatively, in another embodiment, the bottom doped region 403 and the top doped region 407 may have the second electrical type, and the channel region 405 may have the first electrical type.

With reference to FIGS. 1 to 3, in the embodiment depicted, the pairs of insulating spacers 409 may be attached to two sides of the active column 401. It should be noted that the insulating spacers 409 are attached only to the sides of the active column 401 that are parallel to the direction Y. Sidewalls parallel to the direction Y of the top doped region 407, the channel region 405, and the bottom doped region 403 together form the sides parallel to the direction Y of the active column 401. Top surfaces of the pair of insulating spacers 409 may be at a same level as the top surface 407-1 of the top doped region 407. Bottoms of the pair of insulating spacers 409 may be at a vertical level lower than the vertical level of the top surface of the bottom doped region 403. In other words, the pair of insulating spacers 409 may cover the whole sidewalls, which are parallel to the direction Y, of the top doped region 407 and upper portions of the sidewalls, which are parallel to the direction Y, of the bottom doped region 403. The pair of insulating spacers 409 may be formed of, for example, silicon oxide, silicon nitride, silicon oxynitride, silicon nitride oxide, or the like.

With reference to FIGS. 1 to 3, in the embodiment depicted, the plurality of bit lines 501 may be disposed adjacent to the sides, which are parallel to the direction Y, of the plurality of active columns 401. Specifically, any of the plurality of bit lines 501 may include a connection portion 503, an extending portion 505, and an adhesion layer 507. The connection portion 503 may extend in the direction Y and have two ends from a top-view perspective. The connection portion 503 may be disposed adjacent to the sidewall, which is parallel to the direction Y, of the bottom doped region 403. A portion of the connection portion 503 may be disposed in a recessed portion of the sidewall of the bottom doped region 403 and may be disposed below one of the pair of insulating spacers 409. The connection portion 503 may electrically connect to the plurality of active columns 401 along the direction Y through the bottom doped region 403.

With reference to FIGS. 1 and 2, in the embodiment depicted, the extending portion 505 may be connected to one of the two ends of the connection portion 503 and may extend in the direction Z. A top surface of the extending portion 505 may be at a same vertical level as the top surface 407-1 of the top doped region 407. The connection portion 503 and the extending portion 505 may be formed of, for example, tungsten, aluminum, copper, nickel, or cobalt. With reference to FIGS. 1 to 3, in the embodiment depicted, the adhesion layer 507 may be disposed between the bottom doped region 403 and the connection portion 503. The adhesion layer 507 may be formed of, for example, titanium, titanium nitride, tantalum nitride, ruthenium, tungsten, or tungsten nitride. The presence of the adhesion layer 507 may provide improved adhesion and reduced electrical resistance between the connection portion 503 and the bottom doped region 403.

With reference to FIGS. 1 to 3, in the embodiment depicted, the second insulating layer 703 may be parallel to the direction Y and disposed between the plurality of bit lines 501. The second insulating layer 703 may disposed between the plurality of active columns 401. A top surface of the second insulating layer 703 may be at a same vertical level as the vertical level of the top surface of the first insulating layer 701. Bottoms of the second insulating layer 703 may be at a vertical level lower than a vertical level of the bottom of the bottom doped region 403. The second insulating layer 703 may be formed of a same material as the first insulating layer 701, but is not limited thereto.

With reference to FIGS. 1 and 4, in the embodiment depicted, the plurality of word lines 601 may extend in a direction X and disposed adjacent to sides of the plurality of active columns 401. It should be noted that the plurality of word lines 601 may be attached only to sides of the plurality of active columns 401 parallel to the direction X. Specifically, one of the plurality of word lines 601 may include a word line insulating layer 603 and a word line conductive layer 605.

With reference to FIGS. 1 and 4, in the embodiment depicted, the word line insulating layer 603 may extend in the direction X. The word line insulating layer 603 may be attached to the sides, parallel to the direction X, of the active column 401. A top surface of the word line insulating layer 603 may be at a same vertical level as the top surface 407-1 of the top doped region 407. A bottom of the word line insulating layer 603 may be at a vertical level lower than the vertical level of the top surface of the bottom doped region 403. Specifically, the word line insulating layer 603 may include a vertical portion and a horizontal portion. The vertical portion may be attached to the sides of the active column 401. One end of the horizontal portion may connect to a bottom of the vertical portion. An opposite end of the horizontal portion may connect to a bottom of an adjacent vertical portion which may be attached to a side of an adjacent active column 401. The word line insulating layer 603 may be formed of, for example, an insulating material having a dielectric constant of about 4.0 or greater. Alternatively, in another embodiment, the insulating material may be silicon oxide, silicon nitride, silicon oxynitride, silicon nitride oxide, or the like.

With reference to FIGS. 1 and 4, in the embodiment depicted, the word line conductive layer 605 may be attached to the word line insulating layer 603. Specifically, the word line conductive layer 605 may be attached to the vertical portion of the word line insulating layer 603 and disposed on the horizontal portion of the word line insulating layer 603. A top surface of the word line conductive layer 605 may be at a vertical level higher than a top surface of the channel region 405. A bottom of the word line conductive layer 605 may be at a vertical level lower than the vertical level of the top surface of the bottom doped region 403. The word line conductive layer 605 may be formed of, for example, a conductive material such as polysilicon, silicon germanium, metal, metal alloy, metal silicide, metal nitride, or metal carbide. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like.

With reference to FIGS. 1 and 4, in the embodiment depicted, the third insulating layer 705 may extend in the direction X. The third insulating layer 705 may be disposed between adjacent pairs of the plurality of active columns 401. That is, the adjacent pairs of the plurality of active columns 401 may be electrically isolated by the third insulating layer 705. The third insulating layer 705 may be disposed adjacent to the word line insulating layer 603 and the word line conductive layer 605. Specifically, the third insulating layer 705 may be disposed between adjacent pairs of the word line conductive layers 605. A top surface of the third insulating layer 705 may be at a same vertical level as the top surface of the first insulating layer 701. The third insulating layer 705 may be formed of a same material as the first insulating layer 701, but is not limited thereto.

With reference to FIGS. 1 to 4, in the embodiment depicted, the fourth insulating layer 707 may be disposed on the first insulating layer 701, the second insulating layer 703, and the third insulating layer 705. The fourth insulating layer 707 may be formed of a same material as the first insulating layer 701, but is not limited thereto. The plurality of bit line contacts 709 may be disposed in the fourth insulating layer 707. The plurality of bit line contacts 709 may be disposed on the plurality of bit lines 501. Specifically, with reference to FIG. 2, one of the plurality of bit line contacts 709 may be disposed on top surfaces of two extending portions 505 of an adjacent pair of the plurality of bit lines 501 attached to both sides of an active column 401. The plurality of bit line contacts 709 may be disposed on the top surface 407-1 of the top doped region 407. With reference to FIG. 3, the capacitor contact 711 may be disposed on the top doped region 407 and on the pair of insulating spacers 409. The plurality of bit line contacts 709 and the capacitor contact 711 may be formed of, for example, titanium, titanium nitride, tungsten, or tungsten nitride.

Figure 5:
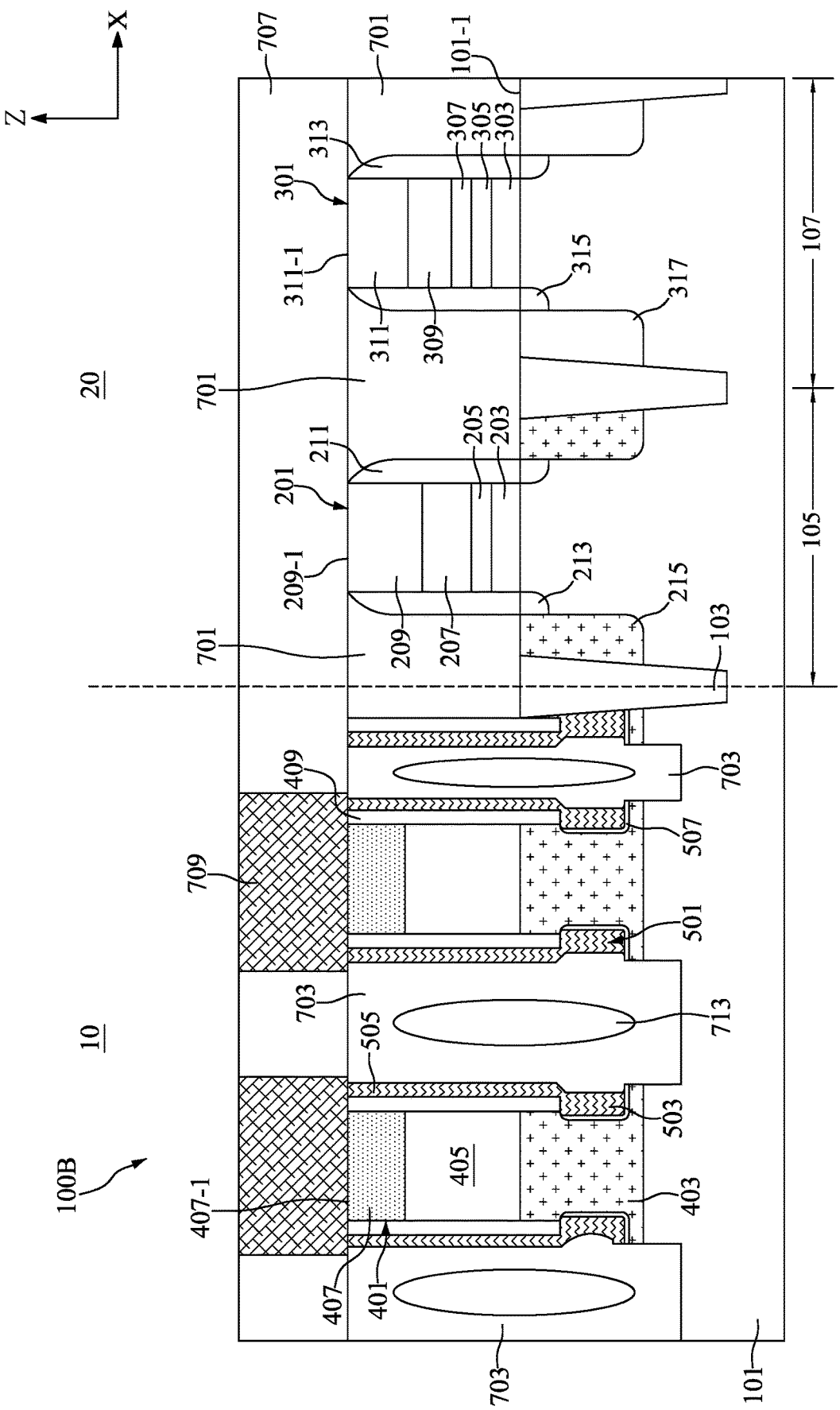
FIG. 5 is a schematic cross-sectional view diagram taken along the line A-A' in FIG. 1 illustrating a semiconductor device in accordance with another embodiment of the present disclosure.
Figure 6:
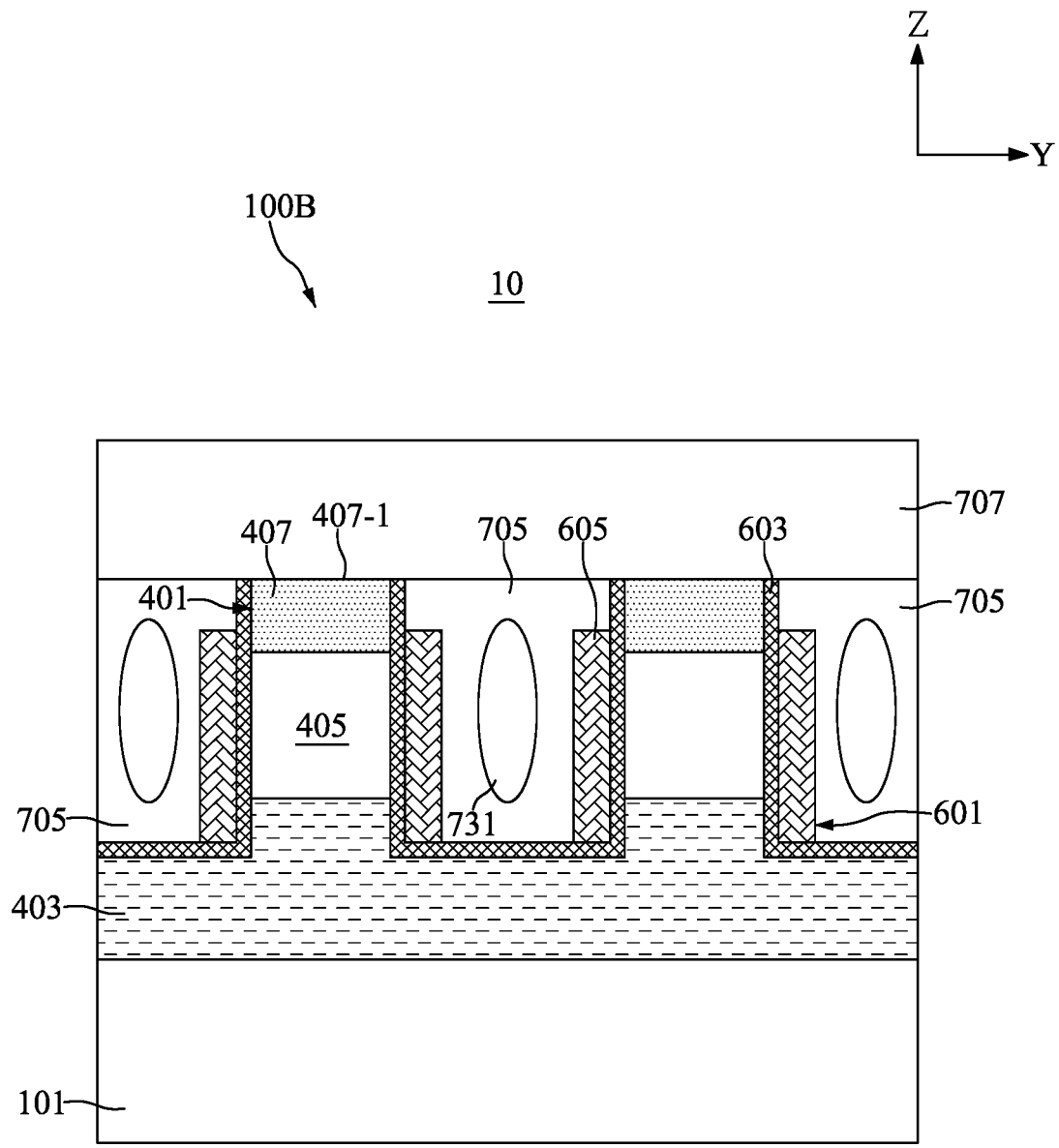
FIG. 6 is a schematic cross-sectional view diagram taken along the line C-C' in FIG. 1 illustrating the semiconductor device in accordance with another embodiment of the present disclosure.

FIG. 5 is a schematic cross-sectional view diagram taken along the line A-A' in FIG. 1 illustrating a semiconductor device 100B in accordance with another embodiment of the present disclosure. FIG. 6 is a schematic cross-sectional view diagram taken along the line C-C' in FIG. 1 illustrating the semiconductor device 100B in accordance with another embodiment of the present disclosure.

With reference to FIGS. 5 and 6, the semiconductor device 100B may include a plurality of air gaps 731. The plurality of air gaps 731 may be disposed in the second insulating layer 703 and the third insulating layer 705. In other words, the plurality of air gaps 731 may be disposed between adjacent pairs of active columns 401 disposed along the direction X and the direction Y. Because the plurality of air gaps 731 are filled with air, a dielectric constant of the plurality of air gaps 731 may be significantly lower than the insulating layers formed of, for example, silicon oxide. Therefore, the plurality of air gaps 731 may significantly reduce the parasitic capacitance between adjacent active columns 401 or between adjacent bit lines 501. That is, the plurality of air gaps 731 may significantly alleviate an interference effect between electrical signals induced or applied to the bit line 501 or the active column 401.

Figure 7:
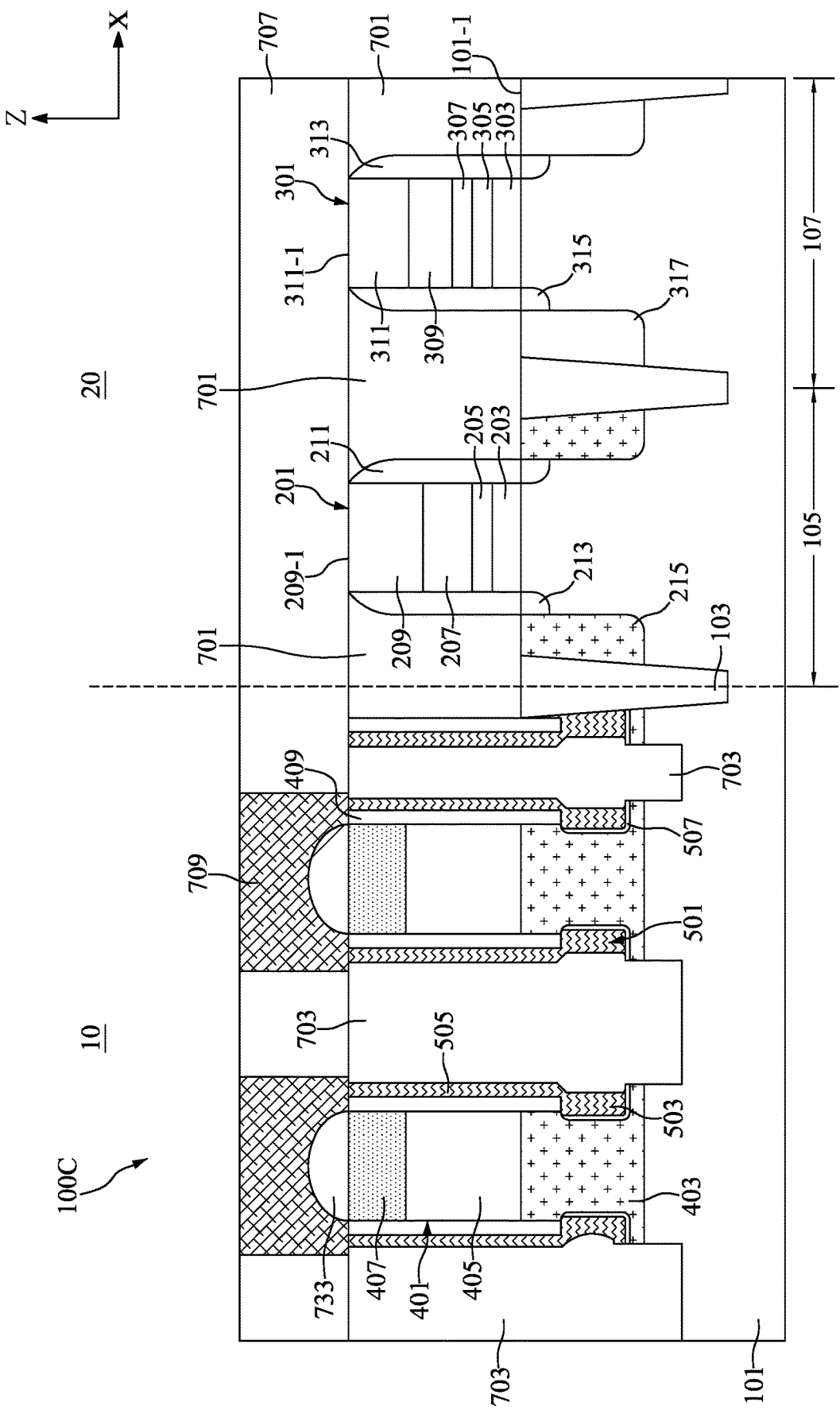
FIG. 7 is a schematic cross-sectional view diagram taken along the line A-A' in FIG. 1 illustrating a semiconductor device in accordance with another embodiment of the present disclosure.

FIG. 7 is a schematic cross-sectional view diagram taken along the line A-A' in FIG. 1 illustrating a semiconductor device 100C in accordance with another embodiment of the present disclosure.

With reference to FIG. 7, the semiconductor device 100C may include a plurality of epitaxial units 733. The plurality of epitaxial units 733 may be respectively correspondingly disposed on the plurality of top doped regions 407. The plurality of epitaxial units 733 may be formed of, for example, silicon carbide. The presence of the plurality of epitaxial units 733 may improve a carrier mobility of the semiconductor device 100C.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

Figure 8:
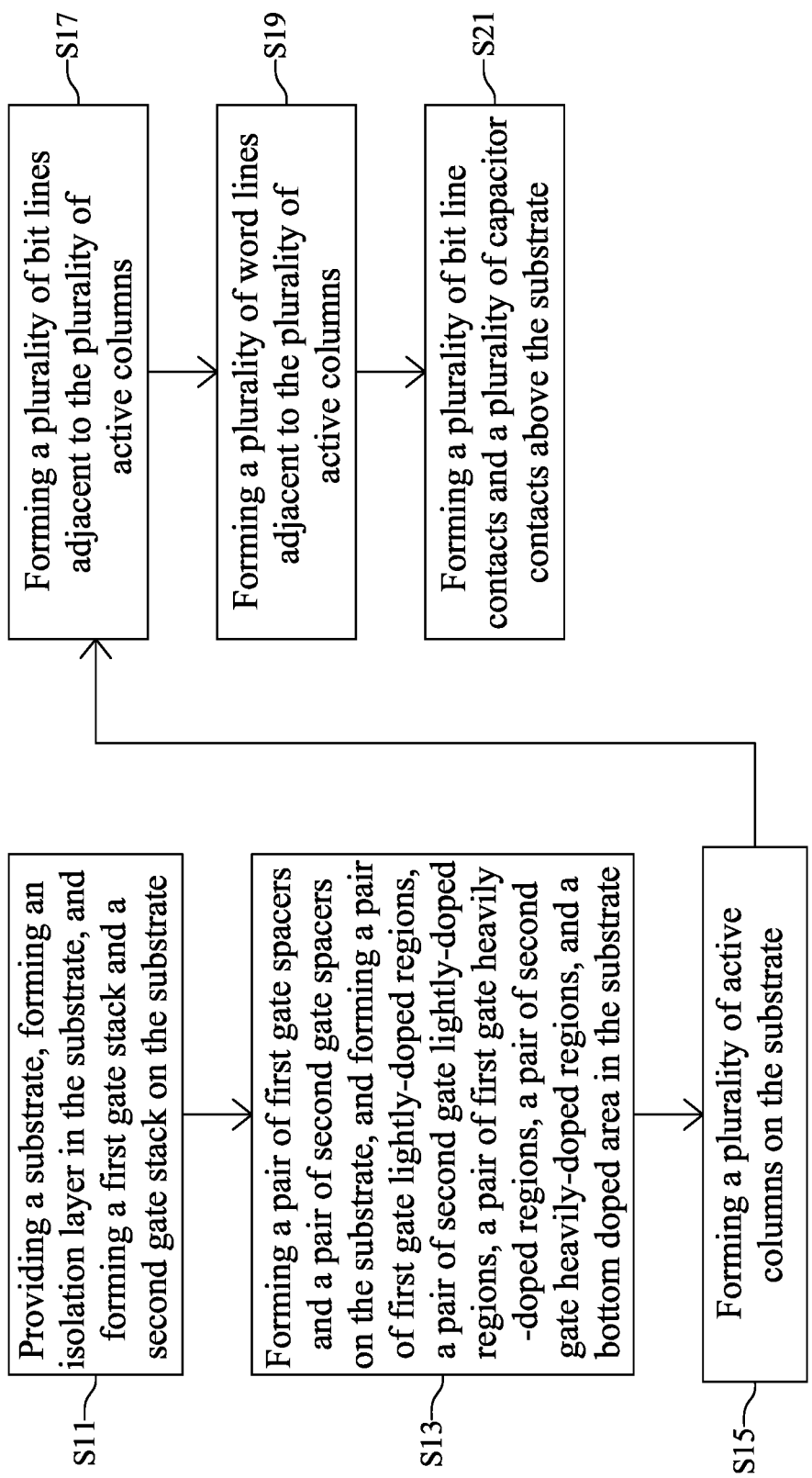
FIG. 8 illustrates, in a flowchart diagram form, a method for fabricating a semiconductor device in accordance with one embodiment of the present disclosure.
Figure 9:
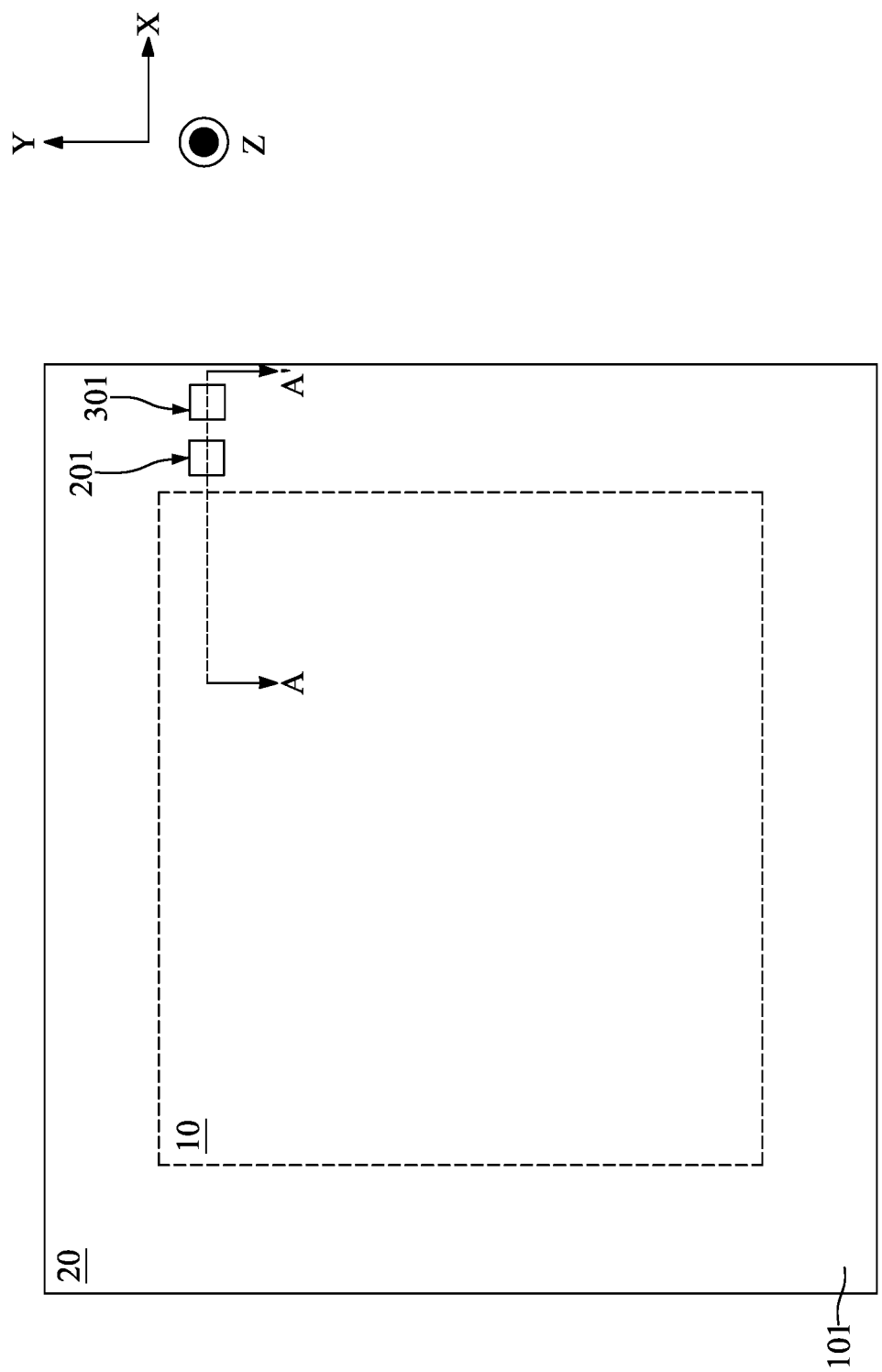
FIG. 9 illustrates, in a schematic top-view diagram, an intermediate semiconductor device in accordance with one embodiment of the present disclosure.

FIG. 8 illustrates, in a flowchart diagram form, a method 30 for fabricating a semiconductor device 100A in accordance with one embodiment of the present disclosure. FIG. 9 illustrates, in a schematic top-view diagram, an intermediate semiconductor device in accordance with one embodiment of the present disclosure. FIGS. 10 to 18 are schematic cross-sectional view diagrams taken along the line A-A' in FIG. 9 illustrating part of a flow for fabricating the semiconductor device 100A in accordance with one embodiment of the present disclosure.

Figure 10:
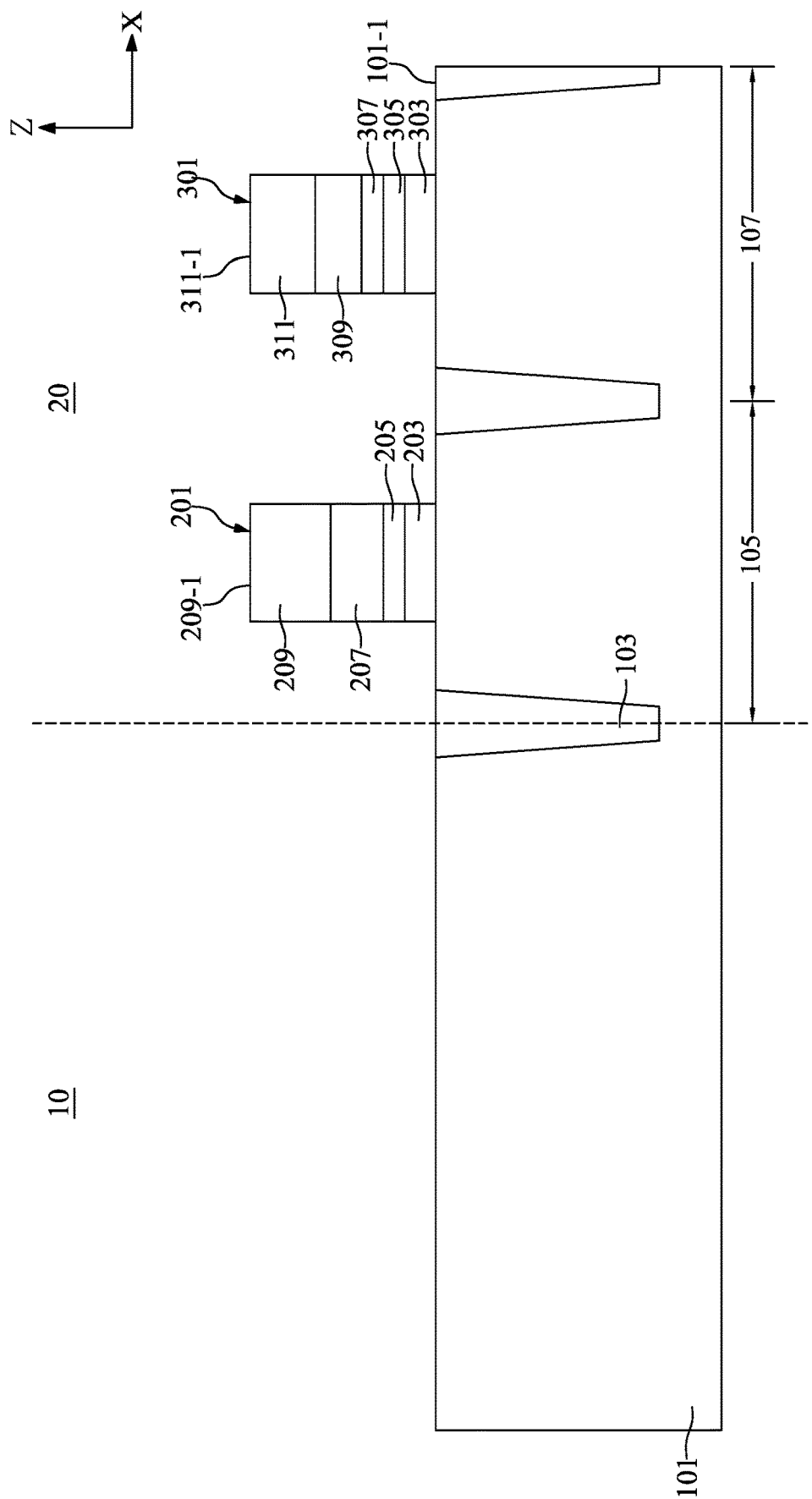
FIGS. 10 to 18 are schematic cross-sectional view diagrams taken along the line A-A' in FIG. 9 illustrating part of a flow for fabricating the semiconductor device in accordance with one embodiment of the present disclosure.

With reference to FIGS. 8 to 10, at step S11, in the embodiment depicted, a substrate 101 may be provided, an isolation layer 103 may be formed in the substrate 101, and a first gate stack 201 and a second gate stack 301 may be formed on the substrate 101. The substrate 101 may include a center area 10 and a peripheral area 20 surrounding the center area 10. The isolation layer 103 may define a first active area 105 and a second active area 107 in the peripheral area 20. The first gate stack 201 may be formed on the peripheral area 20 and include, from bottom to top, a first gate insulating layer 203, a first gate bottom conductive layer 205, a first gate filler layer 207, and a first gate mask layer 209. The second gate stack 301 may be formed on the peripheral area 20 and next to the first gate stack 201. The second gate stack 301 may include, from bottom to top, a second gate insulating layer 303, a second gate bottom conductive layer 305, a second gate top conductive layer 307, a second gate filler layer 309, and a second gate mask layer 311. A top surface 209-1 of the first gate mask layer 209 may be at a same vertical level as a top surface 311-1 of the second gate mask layer 311.

Figure 11:
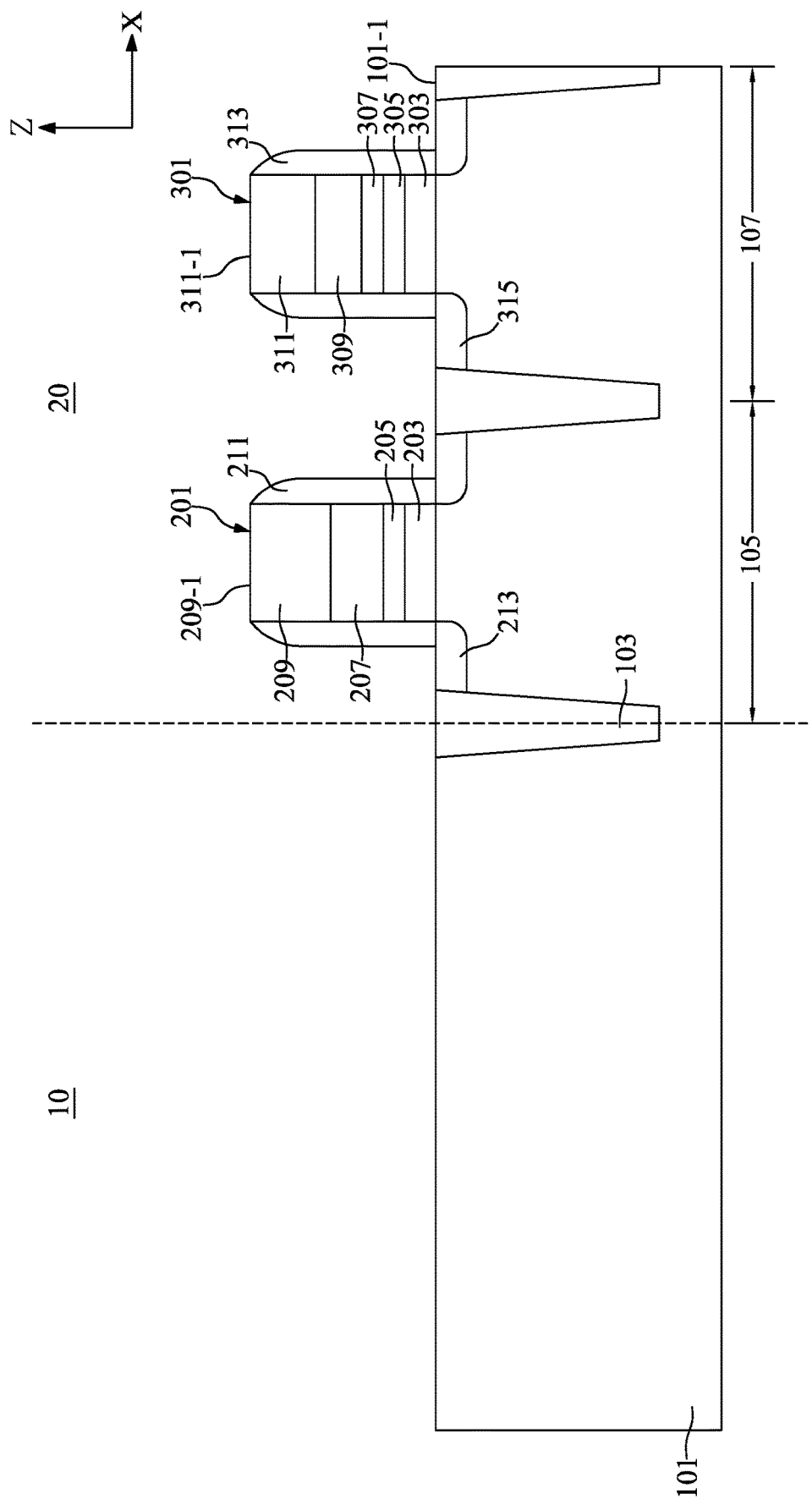

With reference to FIGS. 8 and 11 to 13, at step S13, in the embodiment depicted, a pair of first gate spacers 211 and a pair of second gate spacers 313 may be formed on the peripheral area 20 of the substrate 101, and a pair of first gate lightly-doped regions 213, a pair of second gate lightly-doped regions 315, a pair of first gate heavily-doped regions 215, a pair of second gate heavily-doped regions 317, and a bottom doped area 719 may be formed in the peripheral area 20 of the substrate 101. With reference to FIG. 11, the pair of first gate lightly-doped regions 213 and the pair of second gate lightly-doped regions 315 may be sequentially respectively formed in the first active area 105 and the second active area 107 by implantation processes. The pair of first gate spacers 211 and the pair of second gate spacers 313 may be respectively correspondingly formed attached to sides of the first gate stack 201 and the second gate stack 301.

Figure 12:
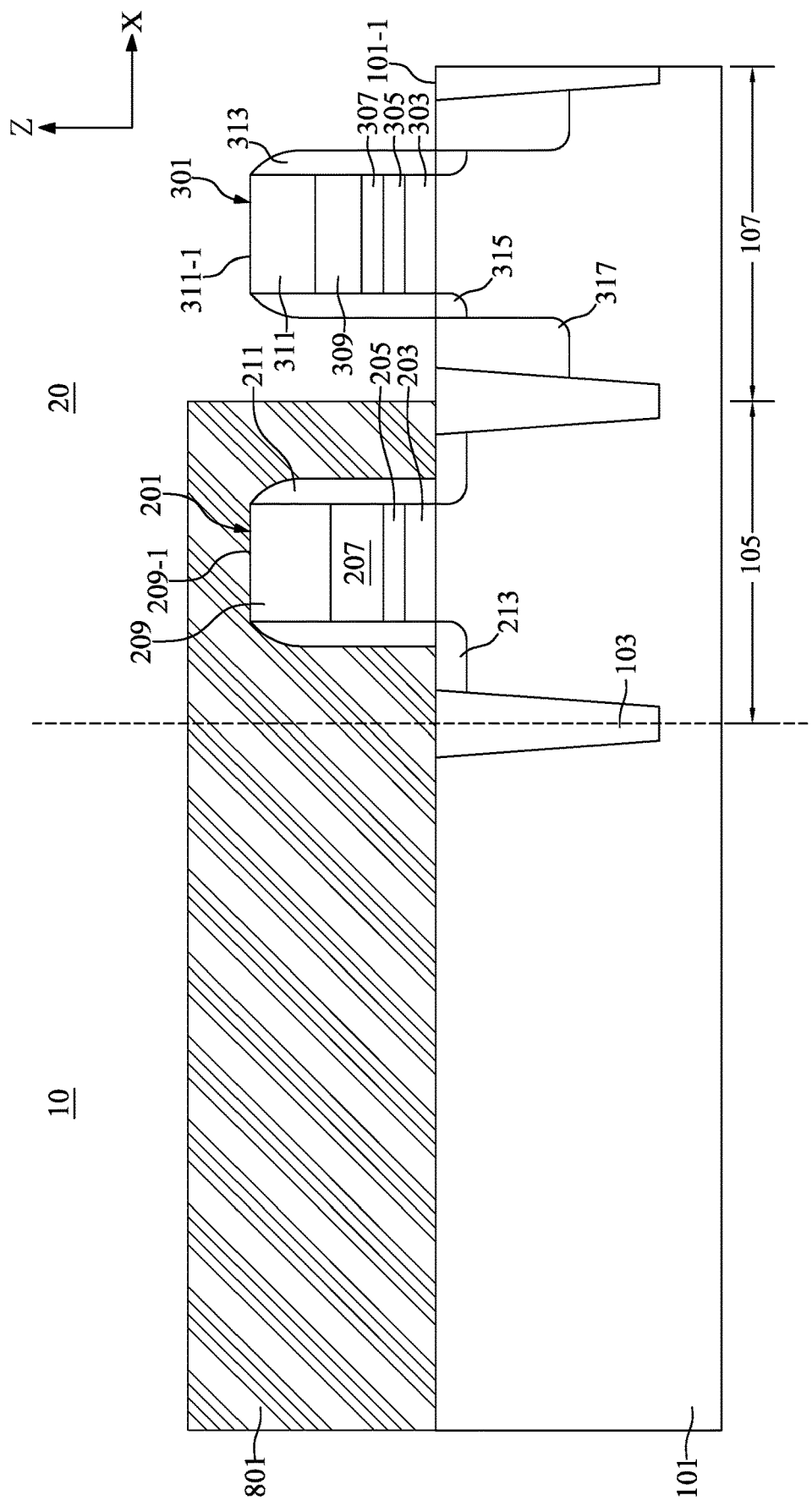
Figure 13:
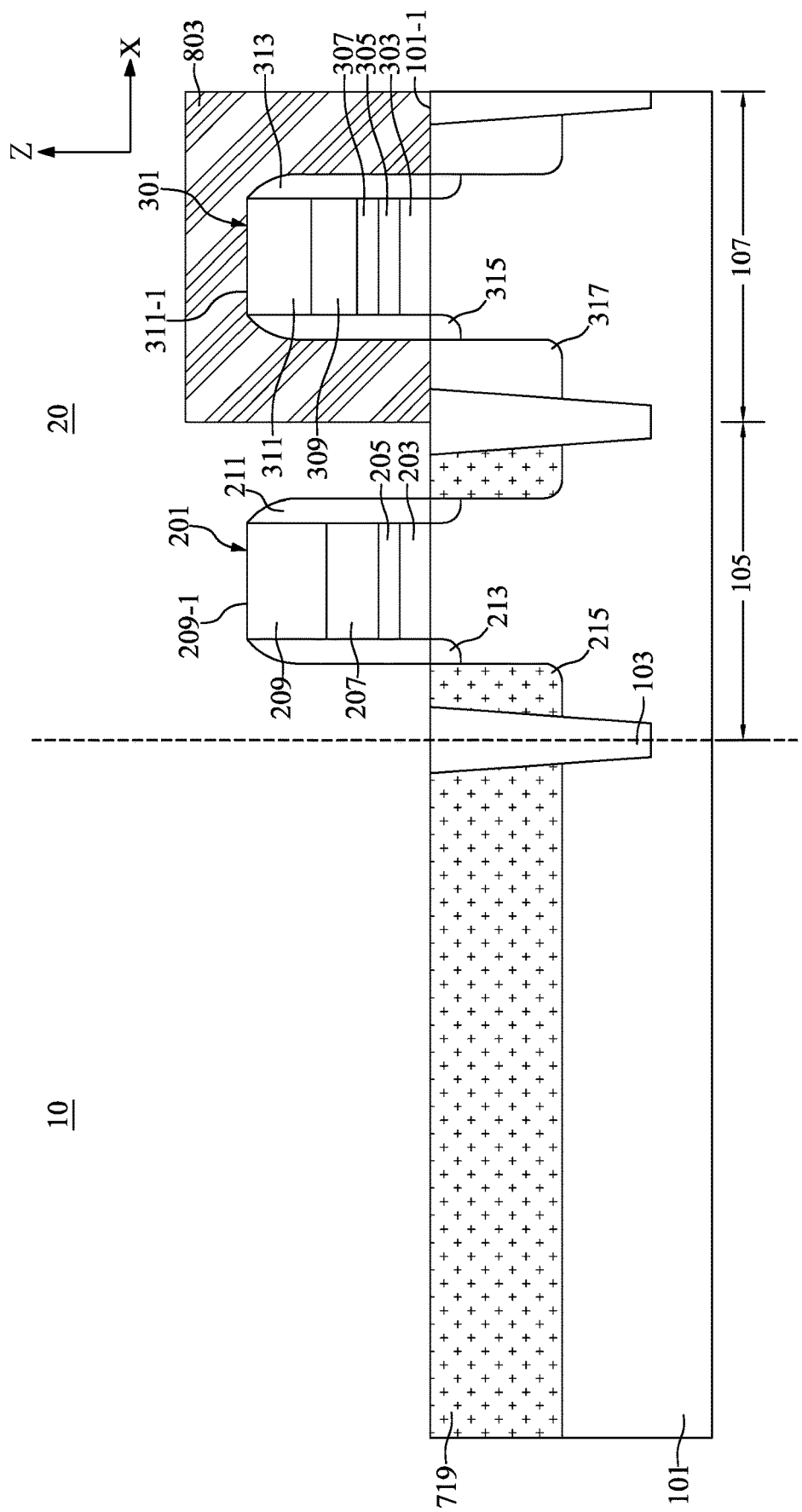
Figure 14:
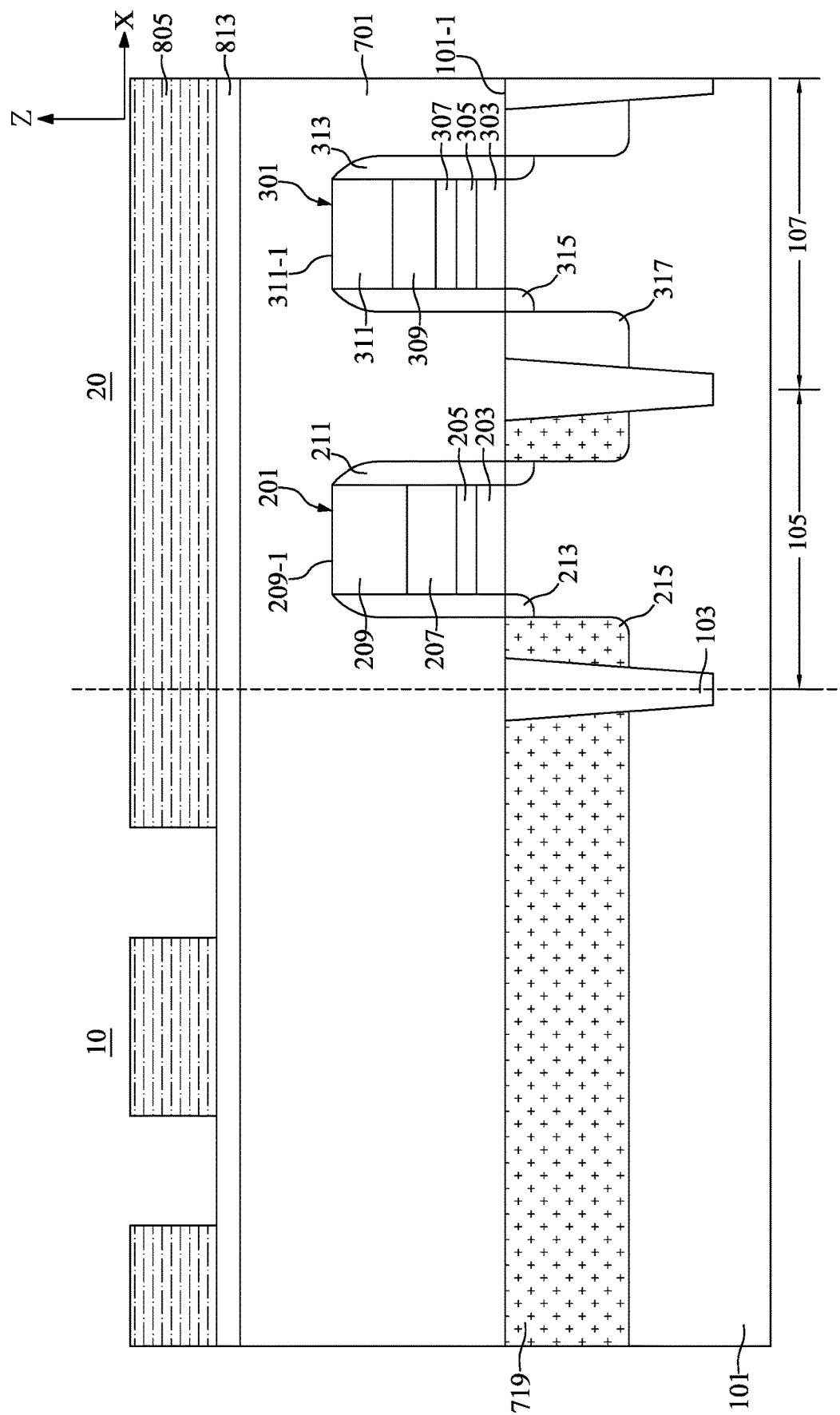
Figure 15:
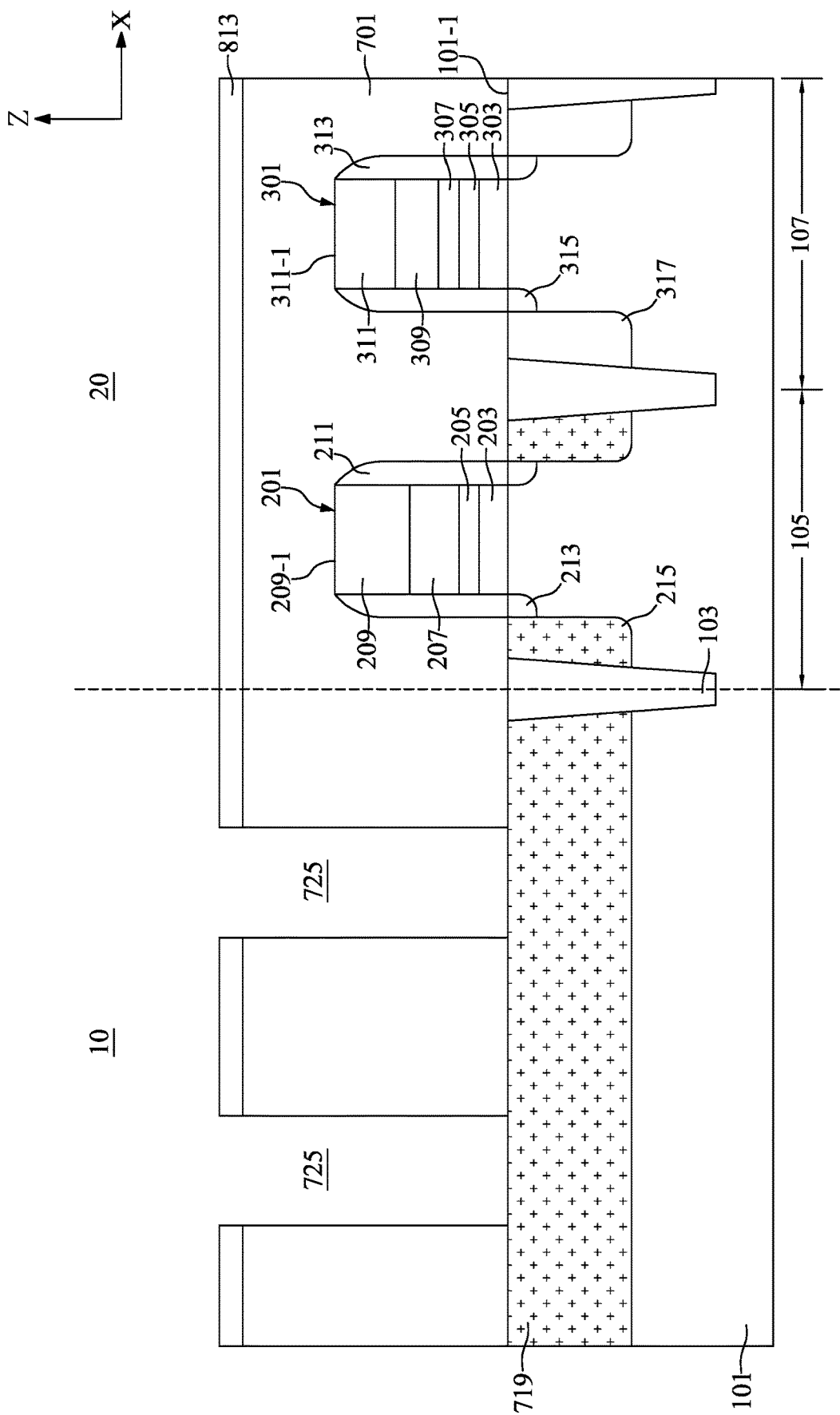

With reference to FIG. 12, a first mask layer 801 may be patterned to cover the center area 10 and the first active area 105. The pair of second gate heavily-doped regions 317 may be formed in the second active area 107 by a first implantation process using a dopant such as boron. After the first implantation process, the first mask layer 801 may be removed. With reference to FIG. 13, a second mask layer 803 may be patterned to cover the second active area 107. A second implantation process may be performed to form the pair of first gate heavily-doped regions 215 in the first active area 105 and the bottom doped area 719 in the center area 10. With reference to FIGS. 8 and 14 to 20, at step S15, in the embodiment depicted, a plurality of active columns 401 may be formed in the center area 10 of the substrate 101. With reference to FIG. 14, a first insulating layer 701 and a first hard mask film 813 may be sequentially formed on the substrate 101. The first insulating layer 701 may cover the first gate stack 201 and the second gate stack 301. The first hard mask film 813 may be formed of, for example, silicon nitride, or silicon nitride oxide. A third mask layer 805 may be patterned to define positions of the plurality of active columns 401 on the first hard mask film 813. With reference to FIG. 15, an etch process, such as an anisotropic dry etch process, may be performed to form a plurality of first trenches 725 in the center area 10. Portions of top surfaces of the bottom doped area 719 may be exposed through the plurality of first trenches 725.

Figure 16:
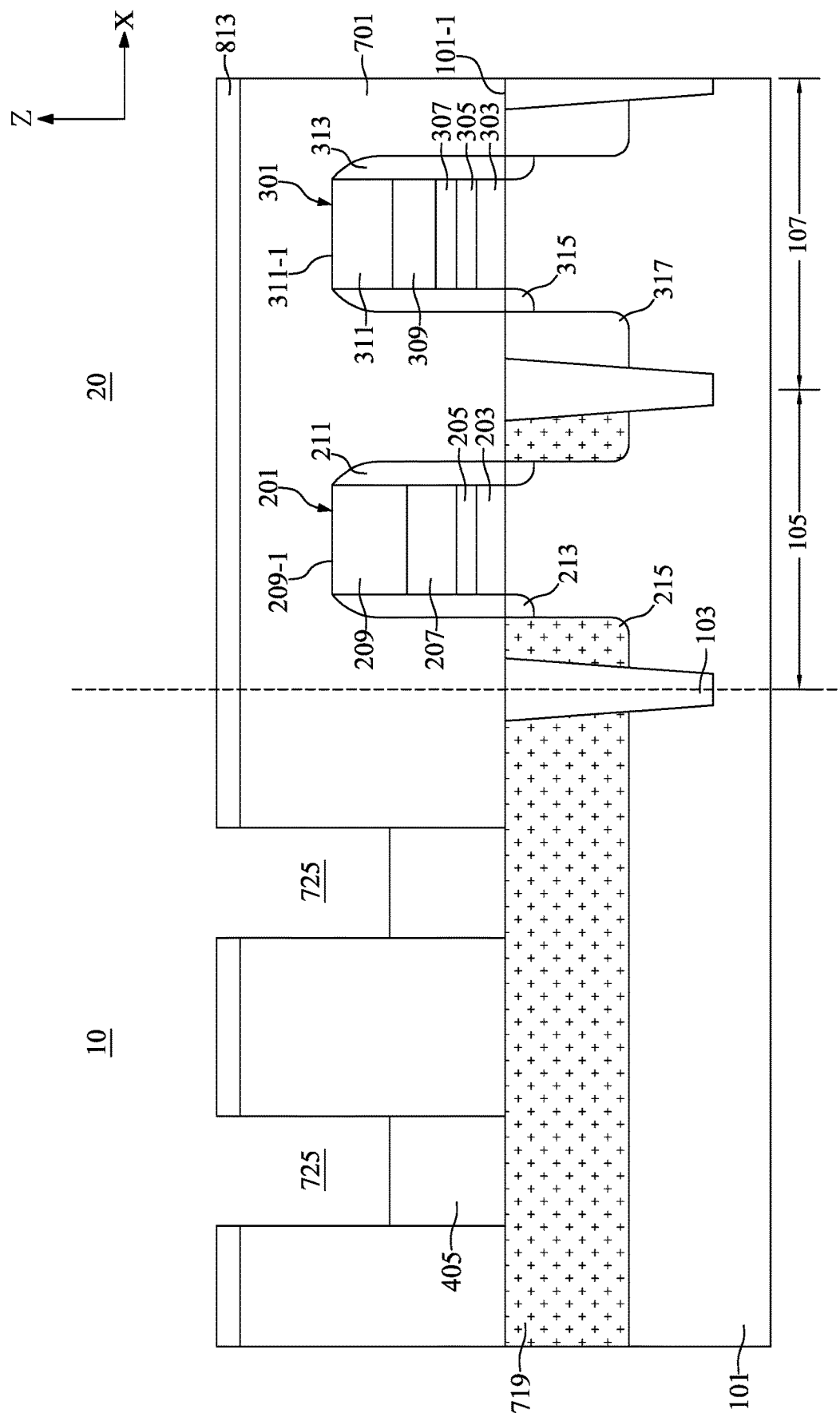
Figure 17:
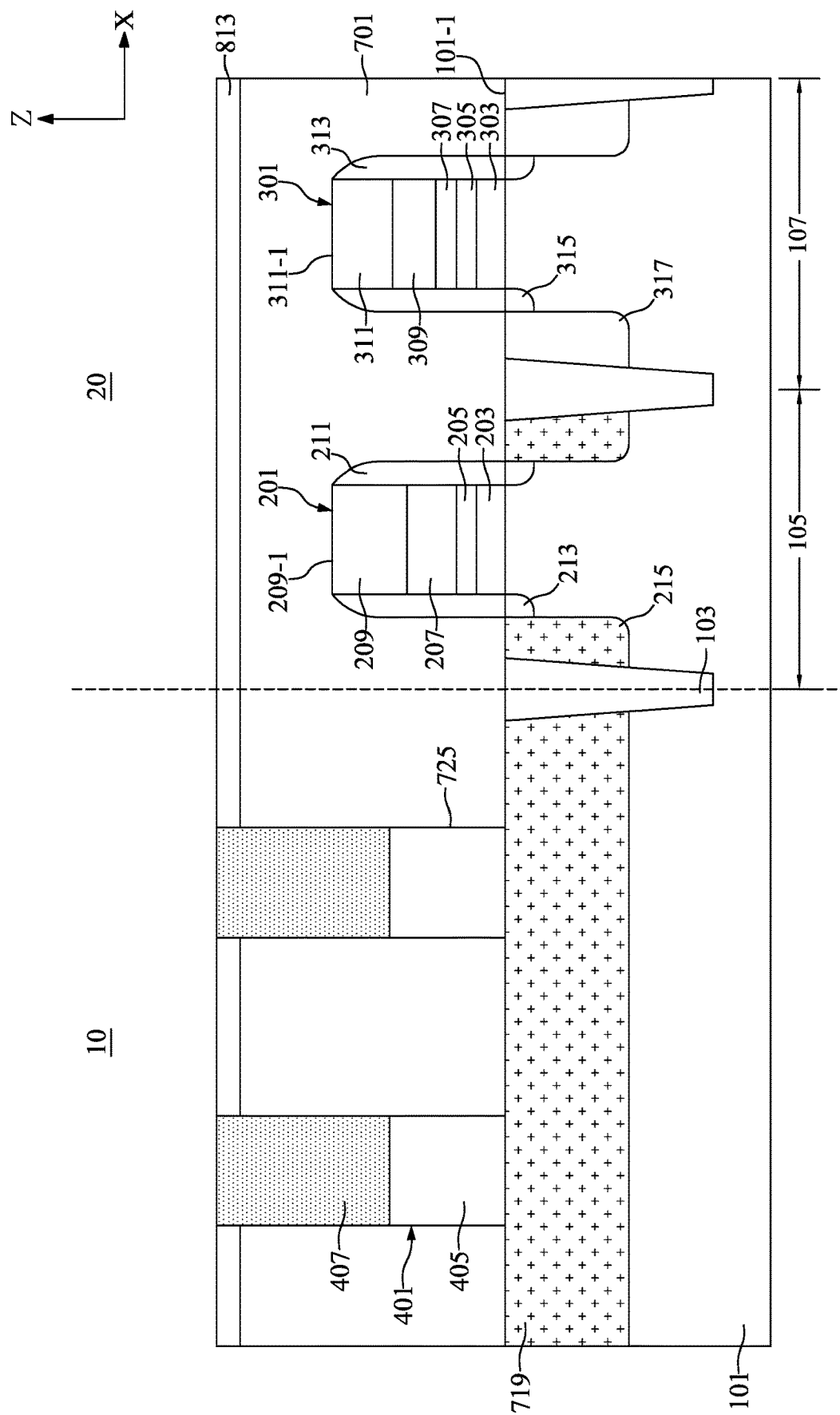

With reference to FIG. 16, a conductive material such as doped silicon may be deposited in the plurality of first trenches 725. A planarization process, such as chemical mechanical polishing, may be performed until the first hard mask film 813 is exposed. An etch-back process may be performed to recess the conductive material in the plurality of first trenches 725 and form the channel regions 405. Alternatively, in another embodiment, the channel regions 405 may be formed by an epitaxy process with in-situ doping. With reference to FIG. 17, top doped regions 407 may be formed by a procedure similar to that illustrated in FIG. 16. In the current stage, top surfaces of the top doped regions 407 may be at a same vertical level as a top surface of the first hard mask film 813.

Figure 18:
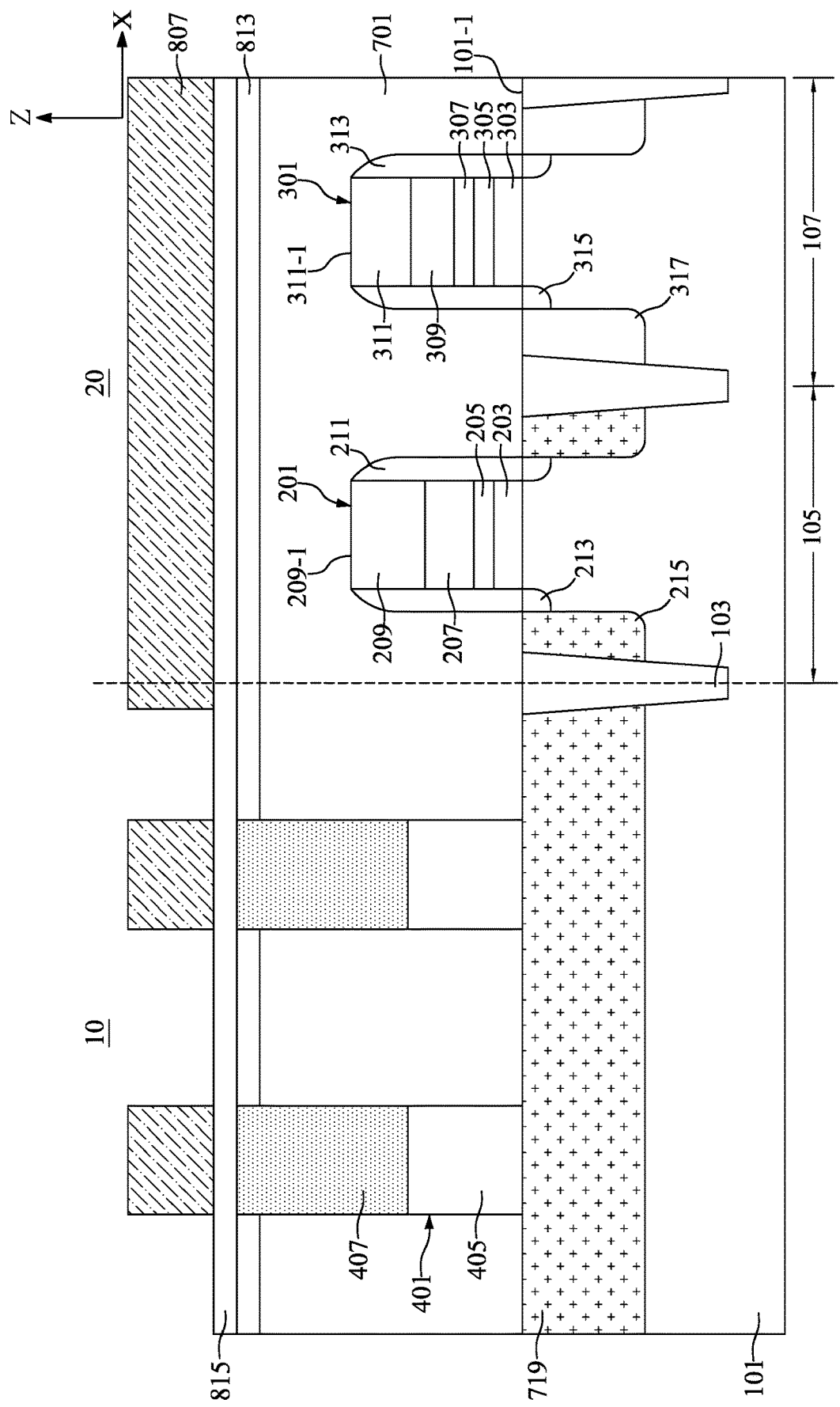
Figure 19:
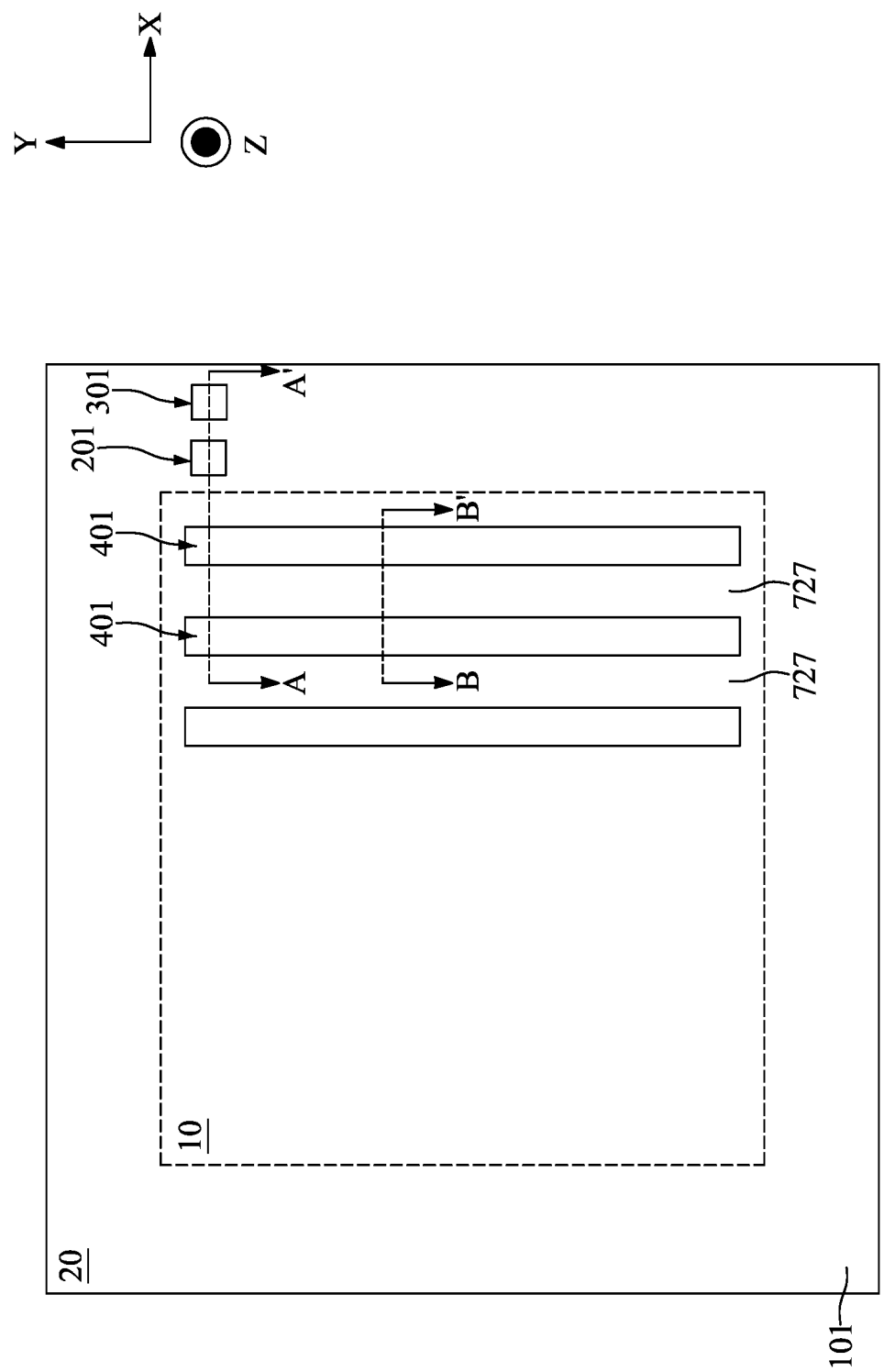
FIG. 19 illustrates, in a schematic top-view diagram, an intermediate semiconductor device in accordance with one embodiment of the present disclosure.
Figure 20:
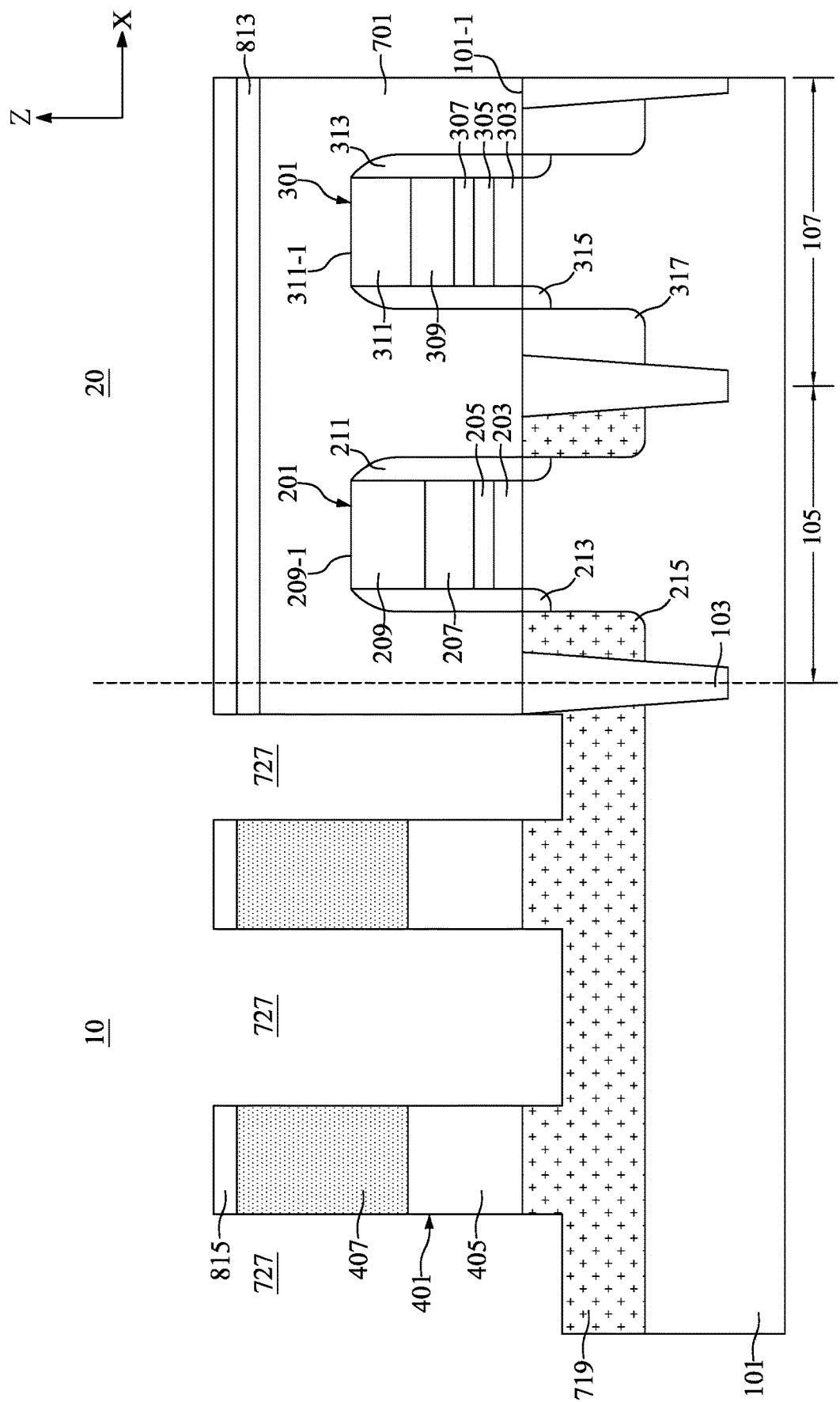
FIGS. 20 to 25 are schematic cross-sectional view diagrams taken along a line A-A' in FIG. 19 illustrating part of the flow for fabricating the semiconductor device in accordance with one embodiment of the present disclosure.

With reference to FIG. 18, a second hard mask film 815 may be deposited on the first hard mask film 813. The second hard mask film 815 may be formed of a same material as the first hard mask film 813, but is not limited thereto. A fourth mask layer 807 may be patterned to define positions of a plurality of second trenches 727 on the second hard mask film 815. With reference to FIGS. 19 and 20, an etch process, such as an anisotropic dry etch process, may be performed to form the plurality of second trenches 727 penetrating the second hard mask film 815, the first hard mask film 813, the first insulating layer 701, and upper portions of the bottom doped area 719. Sidewalls of the top doped regions 407, sidewalls of the channel regions 405, and sidewalls of the upper portions of the bottom doped area 719 may be exposed through the plurality of second trenches 727. The top doped regions 407, the channel regions 405, and portions of the bottom doped area 719 together form the plurality of active columns 401. In the current stage, the plurality of active columns 401 may be rectangular from a top-view perspective and may extend in the direction Y.

FIG. 19 illustrates, in a schematic top-view diagram, an intermediate semiconductor device in accordance with one embodiment of the present disclosure. FIGS. 20 to 25 are schematic cross-sectional view diagrams taken along a line A-A' in FIG. 19 illustrating part of the flow for fabricating the semiconductor device 100A in accordance with one embodiment of the present disclosure.

Figure 21:
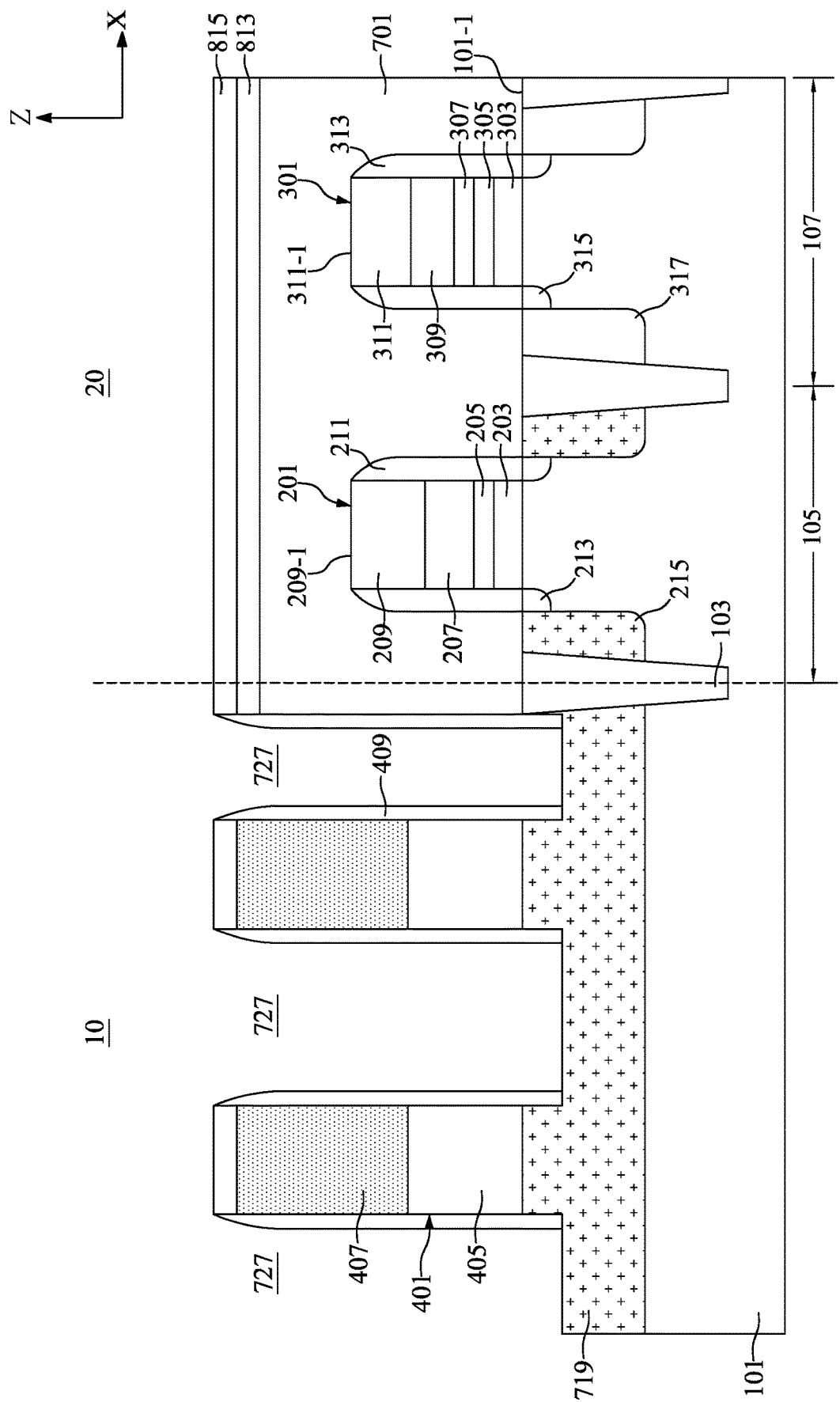

With reference to FIGS. 8 and 21 to 34, at step S17, in the embodiment depicted, a plurality of bit lines 501 may be formed adjacent to the plurality of active columns 401. With reference to FIG. 21, a layer of insulating material may be formed to cover the plurality of second trenches 727. Subsequently, an etch process, such as an anisotropic dry etch process, may be performed to remove portions of the layer of insulating material and form pairs of insulating spacers 409 respectively correspondingly attached to sides of the plurality of active columns 401. In the current stage, portions of top surfaces of the bottom doped area 719 may still be exposed through the plurality of second trenches 727.

Figure 22:
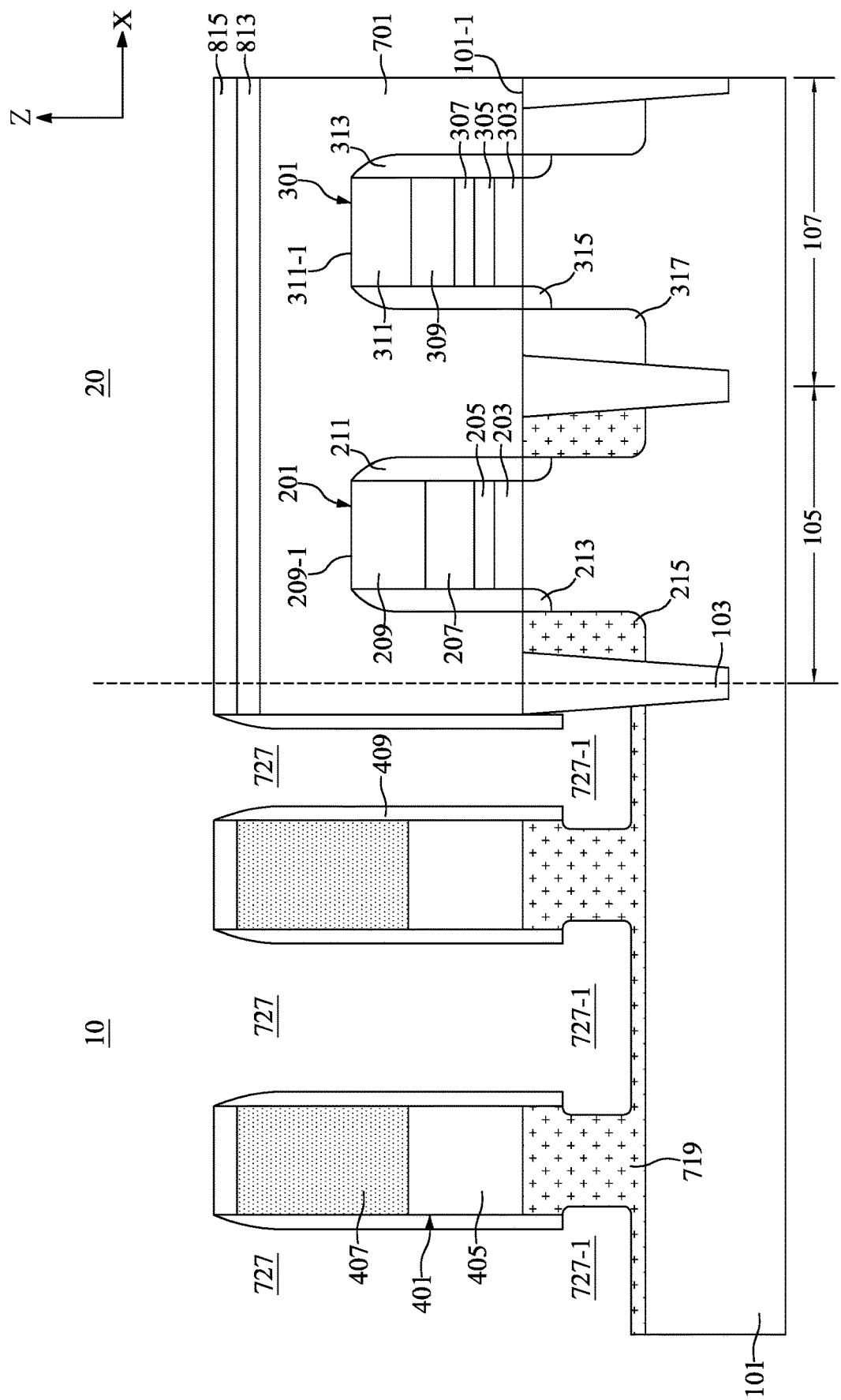
Figure 23:
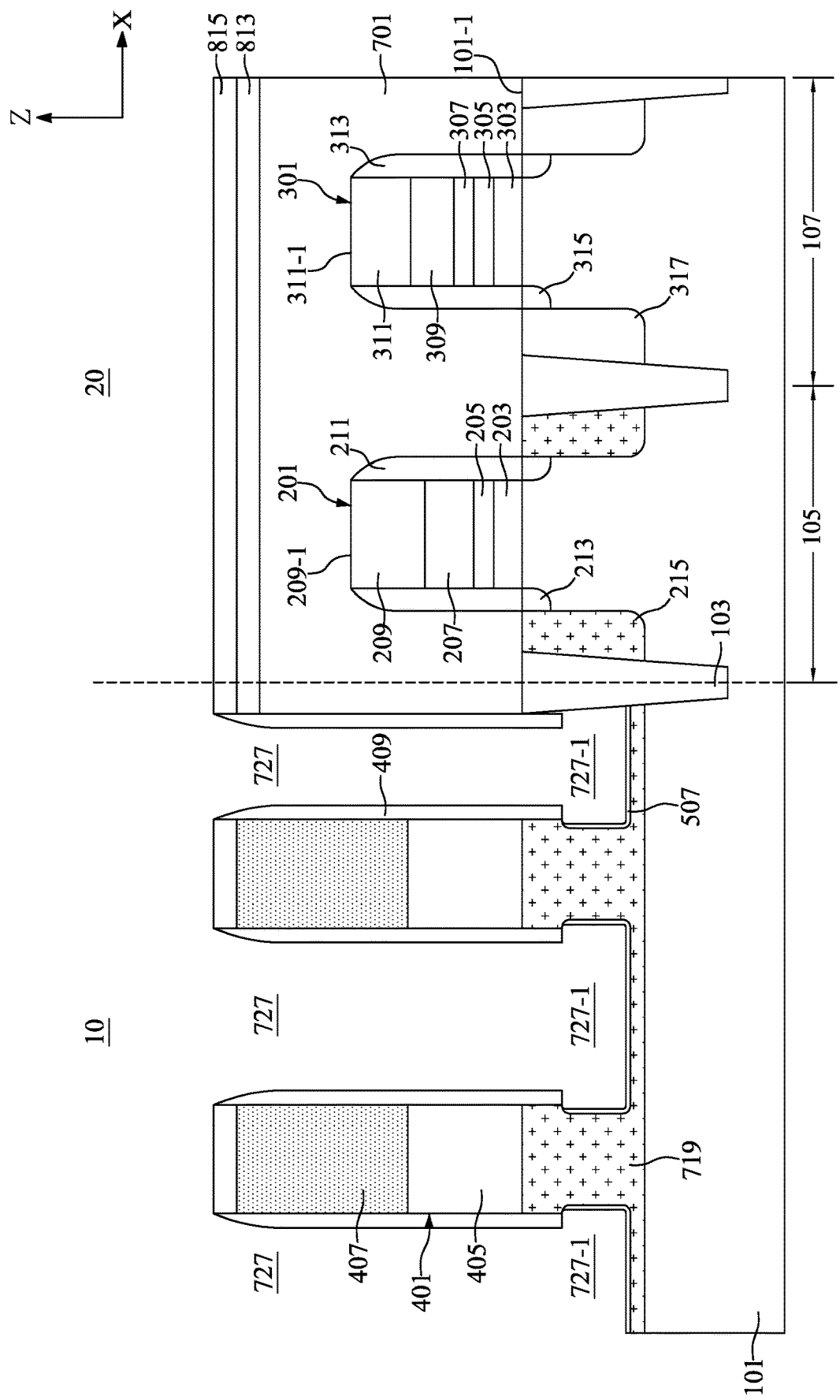
Figure 24:
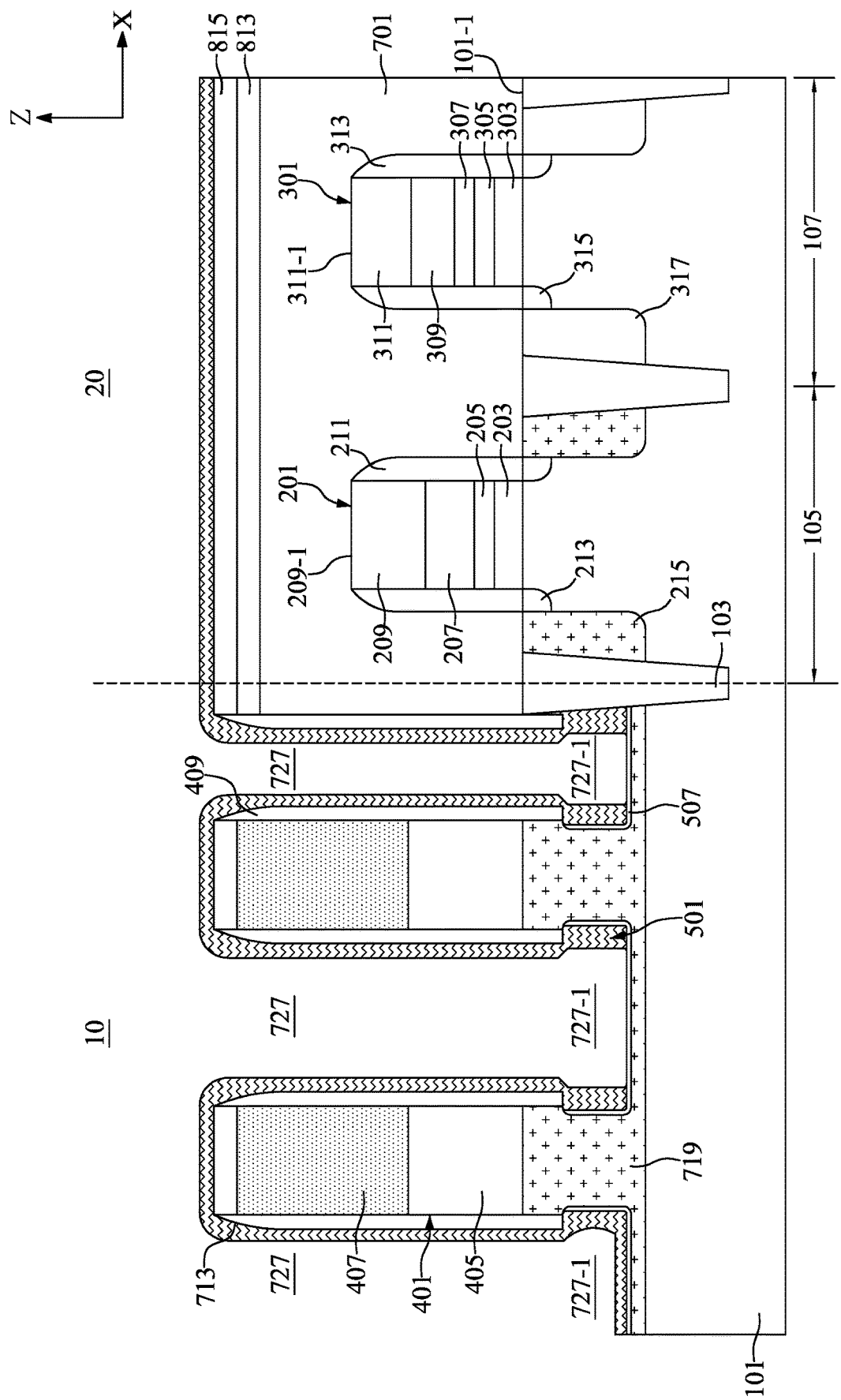

With reference to FIG. 22, a wet bottle etch process may be performed to form recessed portions 727-1 in the bottom doped area 719. Portions of the bottom doped area 719 may be exposed through the recessed portions 727-1. With reference to FIG. 23, a silicidation process may be performed to form adhesion layers 507 on the exposed portions of the bottom doped area 719. With reference to FIG. 24, a bit line conductive material 713 may be deposited to cover sidewalls of the plurality of second trenches 727, sidewalls and bottoms of the recessed portions 727-1, and top surfaces of the second hard mask film 815. The bit line conductive material 713 may be formed of, for example, tungsten, aluminum, copper, nickel, or cobalt.

Figure 25:
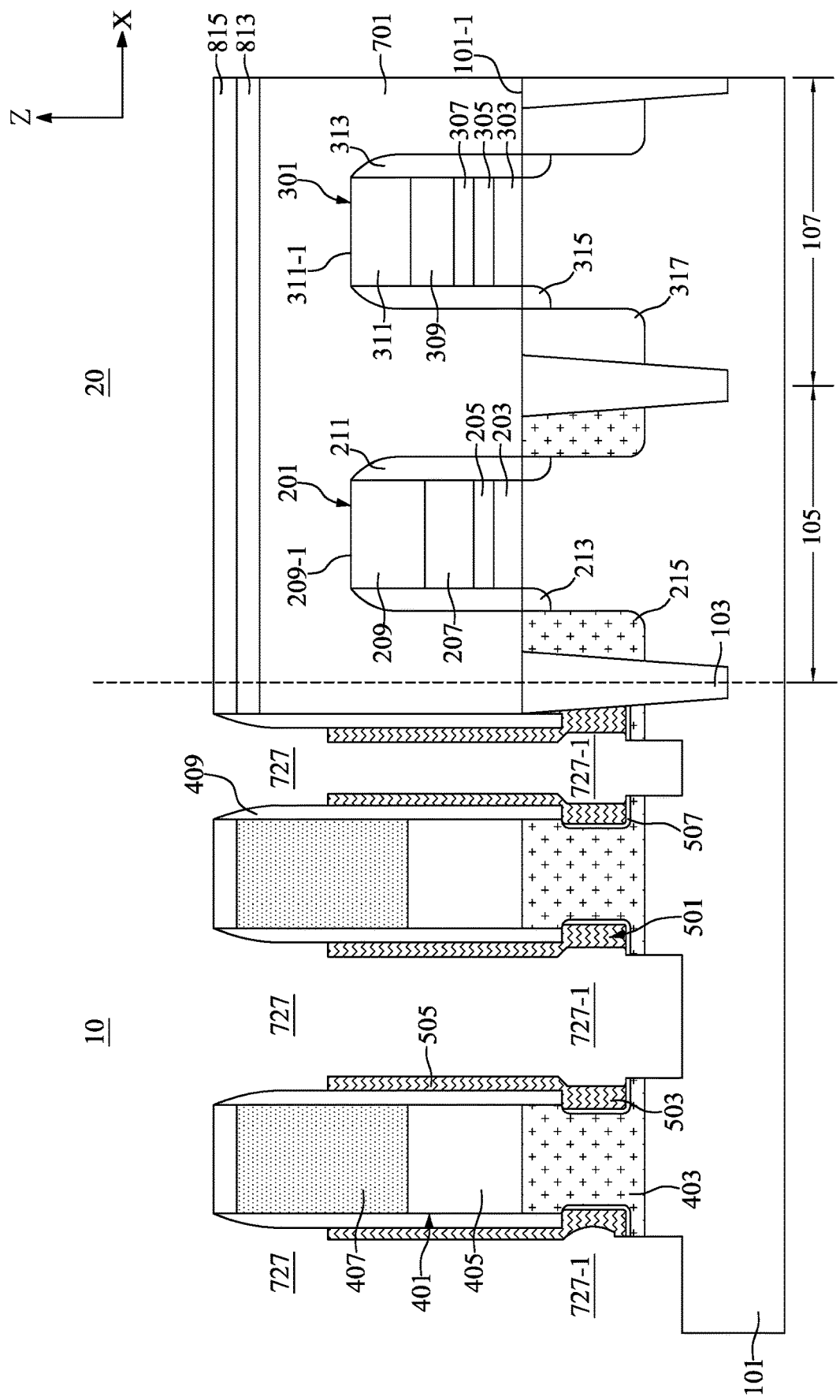

With reference to FIG. 25, an etch process, such as an anisotropic dry etch process, may be performed to remove portions of the bit line conductive material 713 and deepen the bottoms of the recessed portions 727-1. After the etch process, connection portions 503 and extending portions 505 may be concurrently formed. The bottoms of the recessed portions 727-1 may be etched to a vertical level lower than a vertical level of a bottom of the bottom doped area 719, and the bottom doped area 719 may be turned into bottom doped regions 403. The connection portions 503 may be respectively correspondingly formed adjacent to the adhesion layers 507. Bottoms of the extending portions 505 may be respectively correspondingly formed so as to be connected to upper portions of the connection portions 503. The extending portions 505 may be respectively correspondingly formed so as to be attached to sidewalls of the pairs of insulating spacers 409. Top surfaces of the extending portions 505 may be recessed to a vertical level lower than a vertical level of the top surface of the first insulating layer 701. In the current stage, the connection portions 503 and the extending portions 505 may extend in the direction Y. Each of the connection portions 503 may have two ends from a top-view perspective. Each of the extending portions 505 may have two ends from a top-view perspective.

Figure 26:
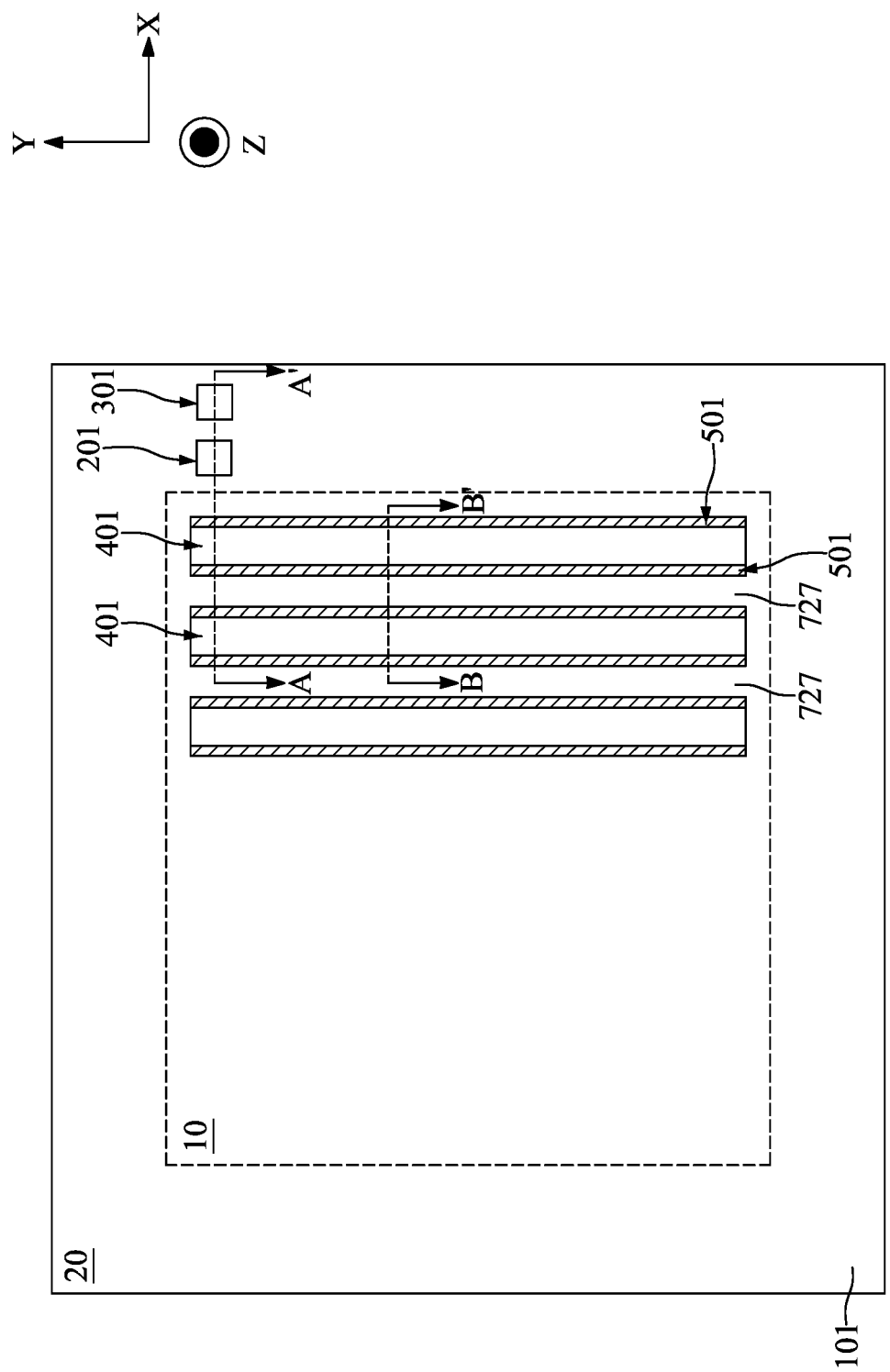
FIG. 26 illustrates, in a schematic top-view diagram, an intermediate semiconductor device in accordance with one embodiment of the present disclosure.
Figure 27:
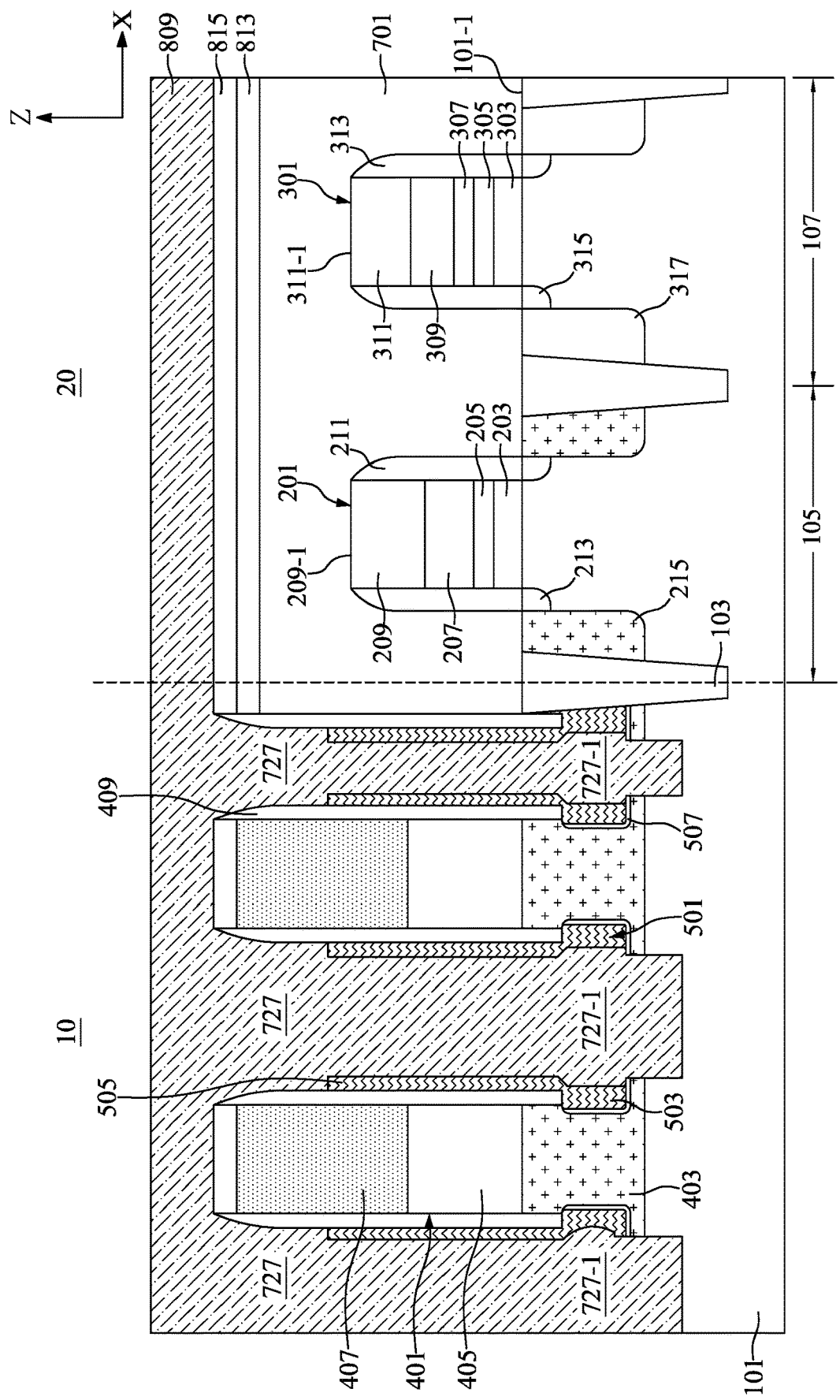
FIG. 27 is a schematic cross-sectional view diagram taken along a line A-A' in FIG. 26 illustrating part of the flow for fabricating the semiconductor device in accordance with one embodiment of the present disclosure.
Figure 28:
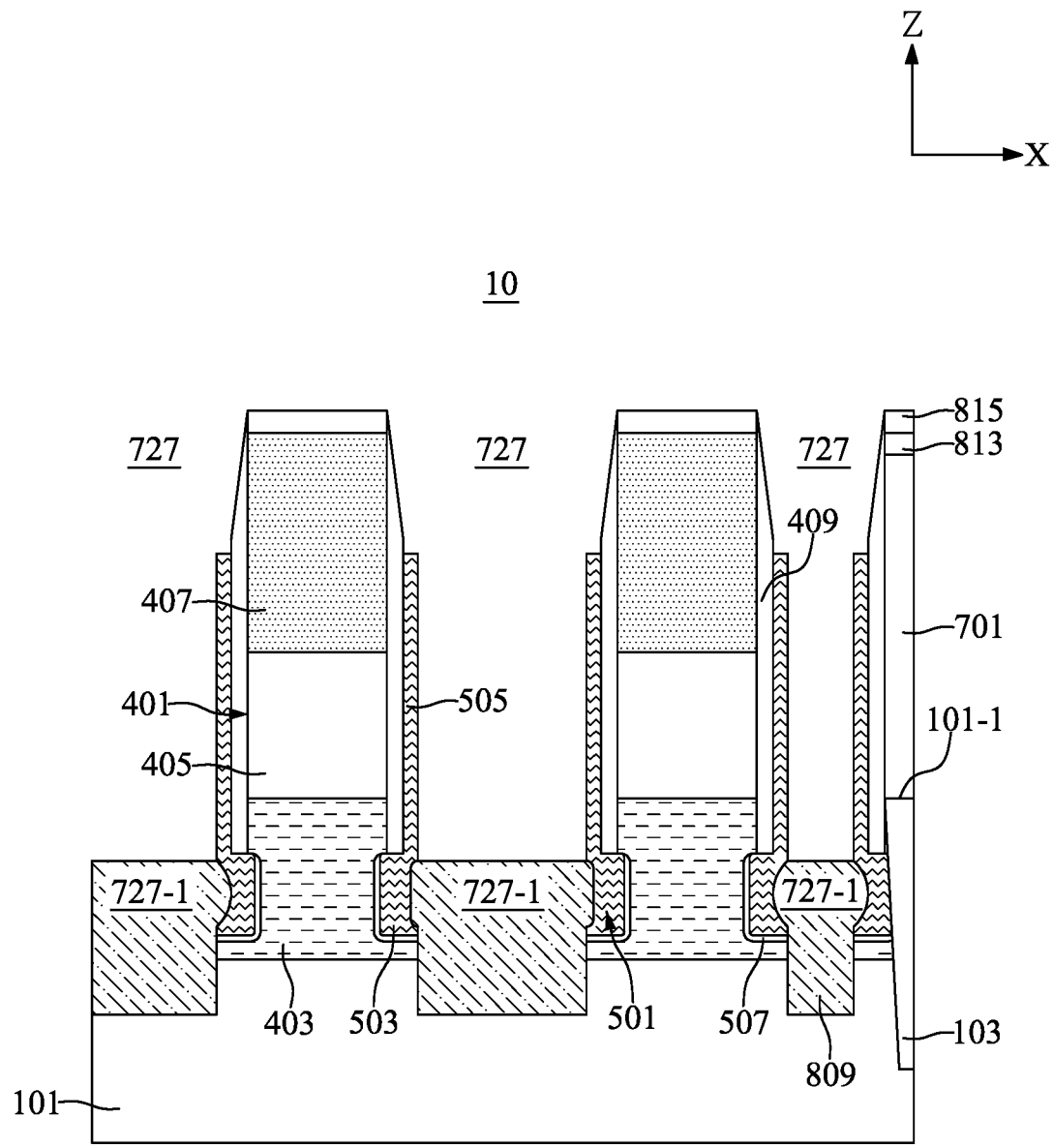
FIG. 28 is a schematic cross-sectional view diagram taken along a line B-B' in FIG. 26 illustrating part of the flow for fabricating the semiconductor device in accordance with one embodiment of the present disclosure.
Figure 29:
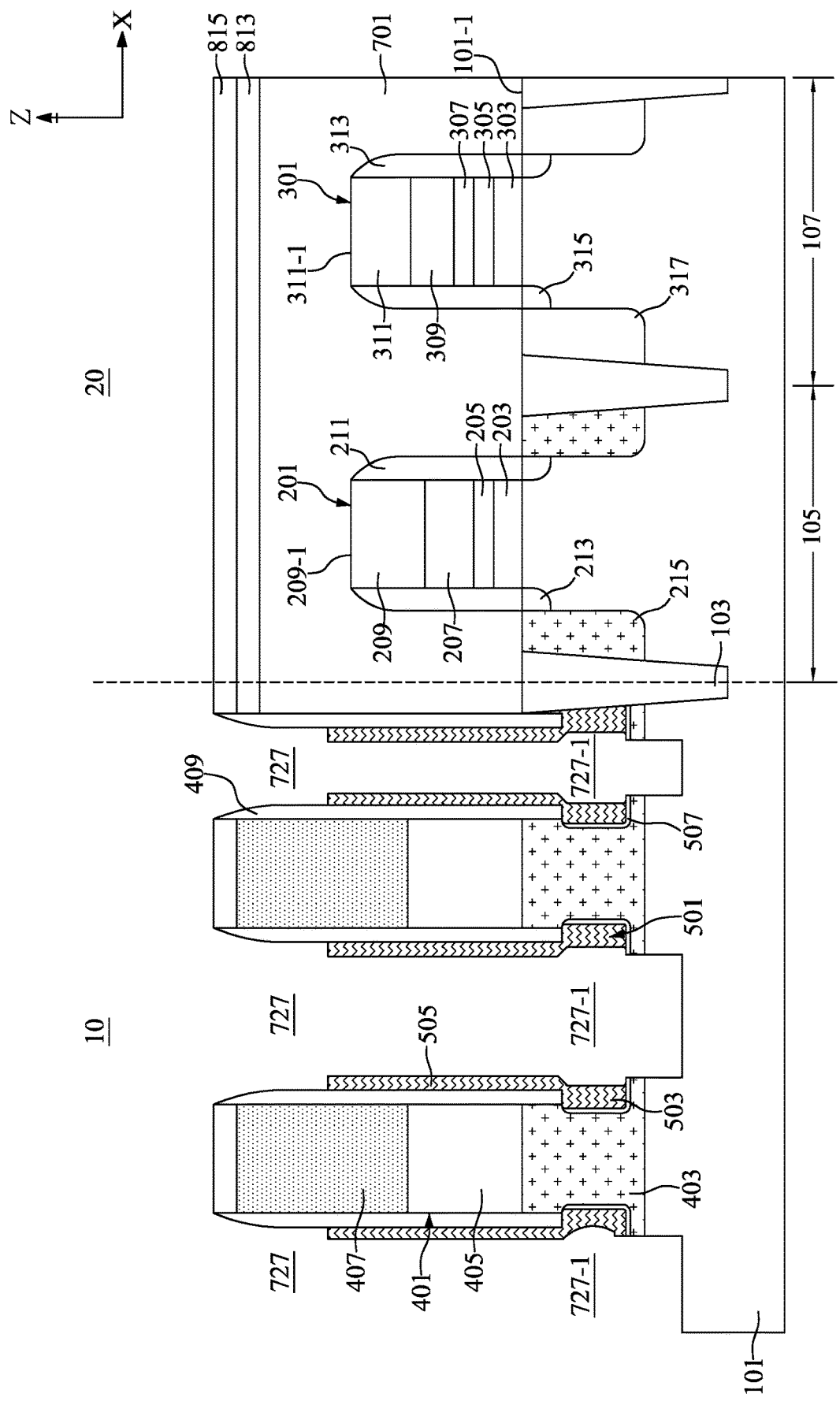
FIG. 29 is a schematic cross-sectional view diagram taken along the line A-A' in FIG. 26 illustrating part of the flow for fabricating the semiconductor device in accordance with one embodiment of the present disclosure.
Figure 30:
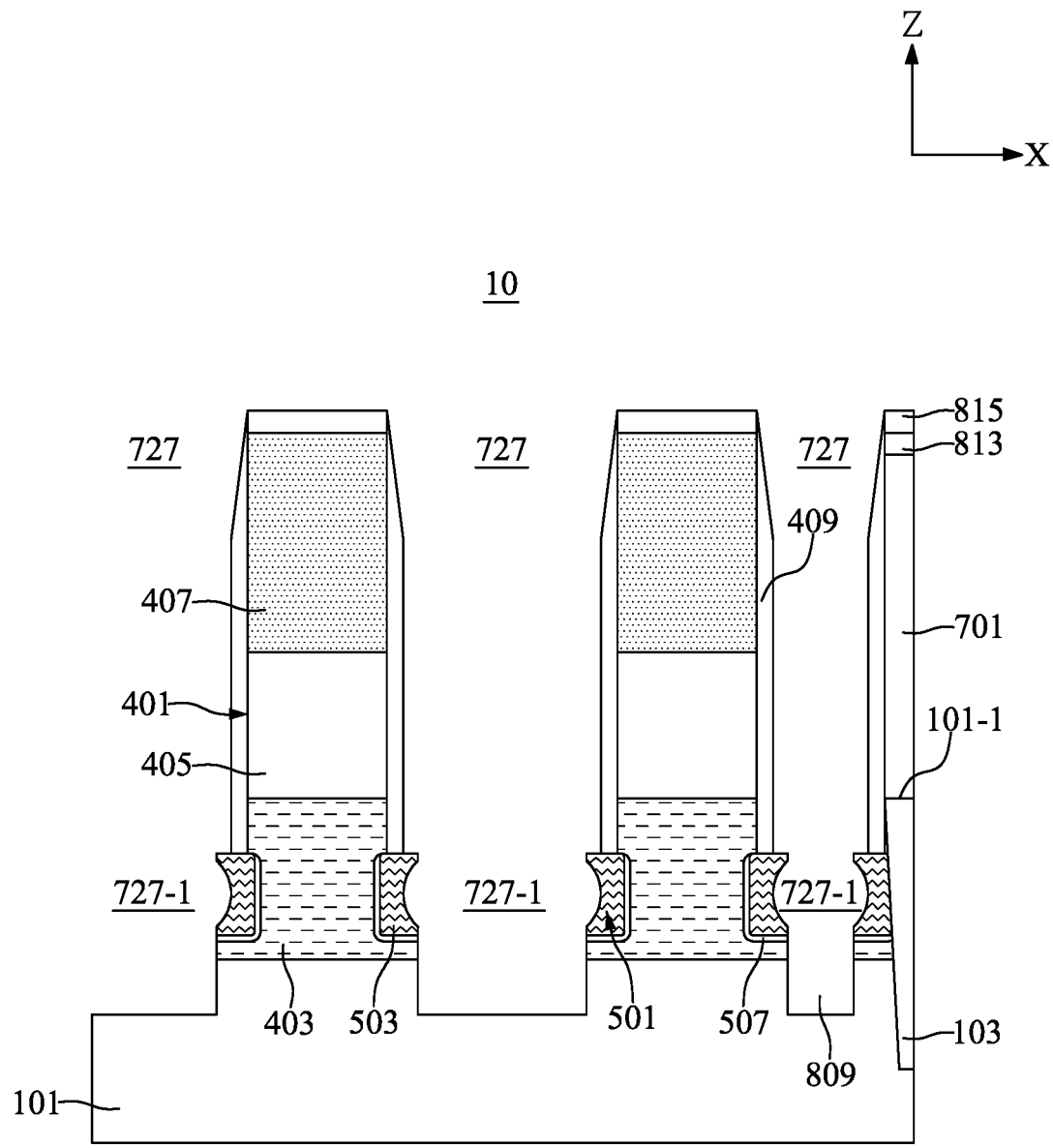
FIG. 30 is a schematic cross-sectional view diagram taken along the line B-B' in FIG. 26 illustrating part of the flow for fabricating the semiconductor device in accordance with one embodiment of the present disclosure.

FIG. 26 illustrates, in a schematic top-view diagram, an intermediate semiconductor device in accordance with one embodiment of the present disclosure. FIG. 27 is a schematic cross-sectional view diagram taken along a line A-A' in FIG. 26 illustrating part of the flow for fabricating the semiconductor device 100A in accordance with one embodiment of the present disclosure. FIG. 28 is a schematic cross-sectional view diagram taken along a line B-B' in FIG. 26 illustrating part of the flow for fabricating the semiconductor device 100A in accordance with one embodiment of the present disclosure. FIG. 29 is a schematic cross-sectional view diagram taken along the line A-A' in FIG. 26 illustrating part of the flow for fabricating the semiconductor device 100A in accordance with one embodiment of the present disclosure. FIG. 30 is a schematic cross-sectional view diagram taken along the line B-B' in FIG. 26 illustrating part of the flow for fabricating the semiconductor device 100A in accordance with one embodiment of the present disclosure.

With reference to FIGS. 26 to 28, a fifth mask layer 809 may be formed in the plurality of second trenches 727, in the recessed portions 727-1, and on top surfaces of the second hard mask film 815. As shown in FIG. 27, the fifth mask layer 809 in a region of one end of the connection portions 503 may be intact. That is, in the region of one end of the connection portions 503, the connection portions 503 and the extending portions 505 may both be still masked by the fifth mask layer 809. In contrast, as shown in FIG. 28, the fifth mask layer 809 may be recessed so that only portions of the fifth mask layer 809 near the connection portions 503 in the recessed portions 727-1 remain. That is, in regions of the recessed fifth mask layer 809, the extending portions 505 may be exposed through the plurality of second trenches 727, and the connection portions 503 may be still masked by the fifth mask layer 809. With reference to FIGS. 29 and 30, an etch process, such as an anisotropic dry etch process, may be performed to remove the exposed extending portions 505. After the etch process, the fifth mask layer 809 may be removed.

Figure 31:
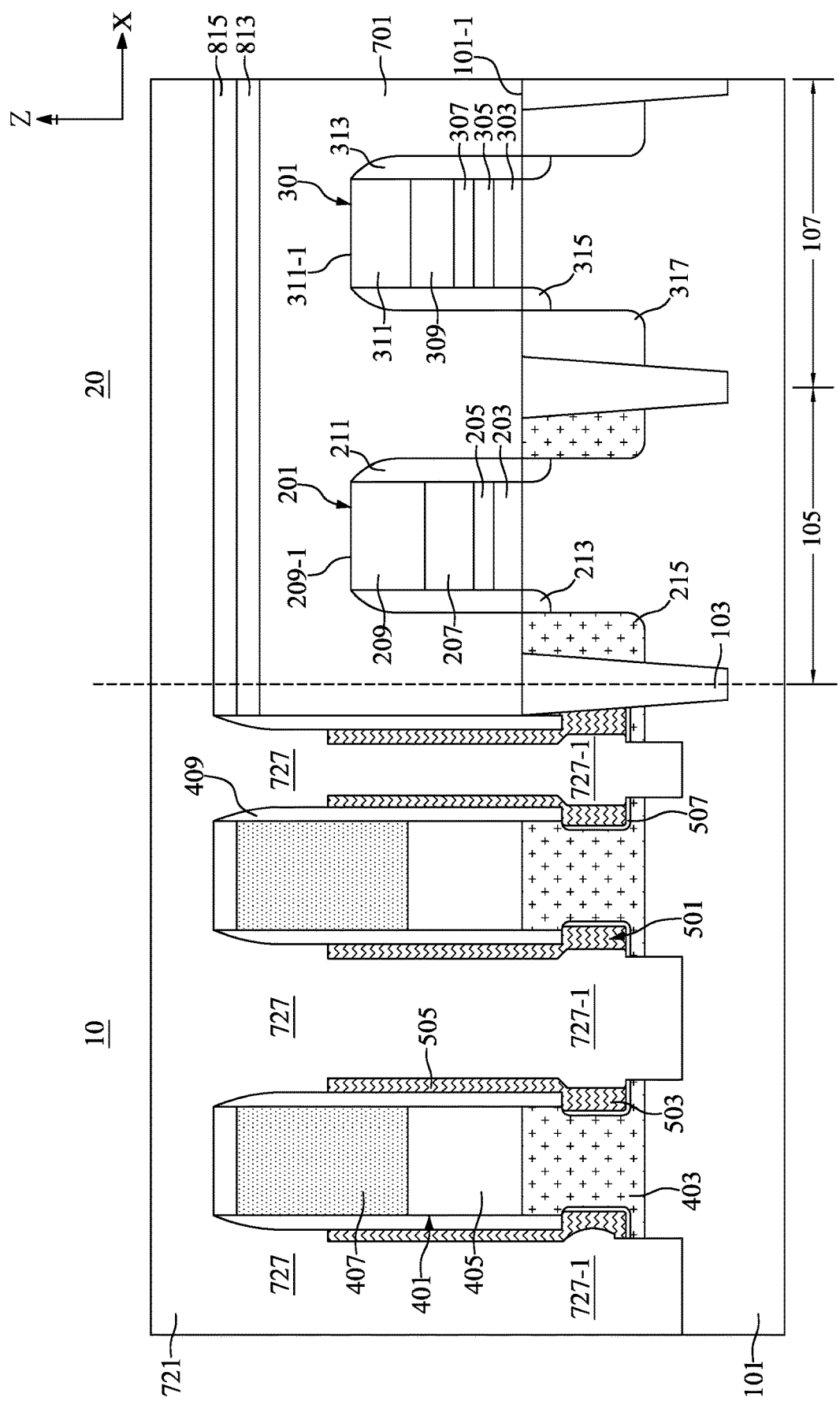
FIG. 31 is a schematic cross-sectional view diagram taken along the line A-A' in FIG. 26 illustrating part of the flow for fabricating the semiconductor device in accordance with one embodiment of the present disclosure.
Figure 32:
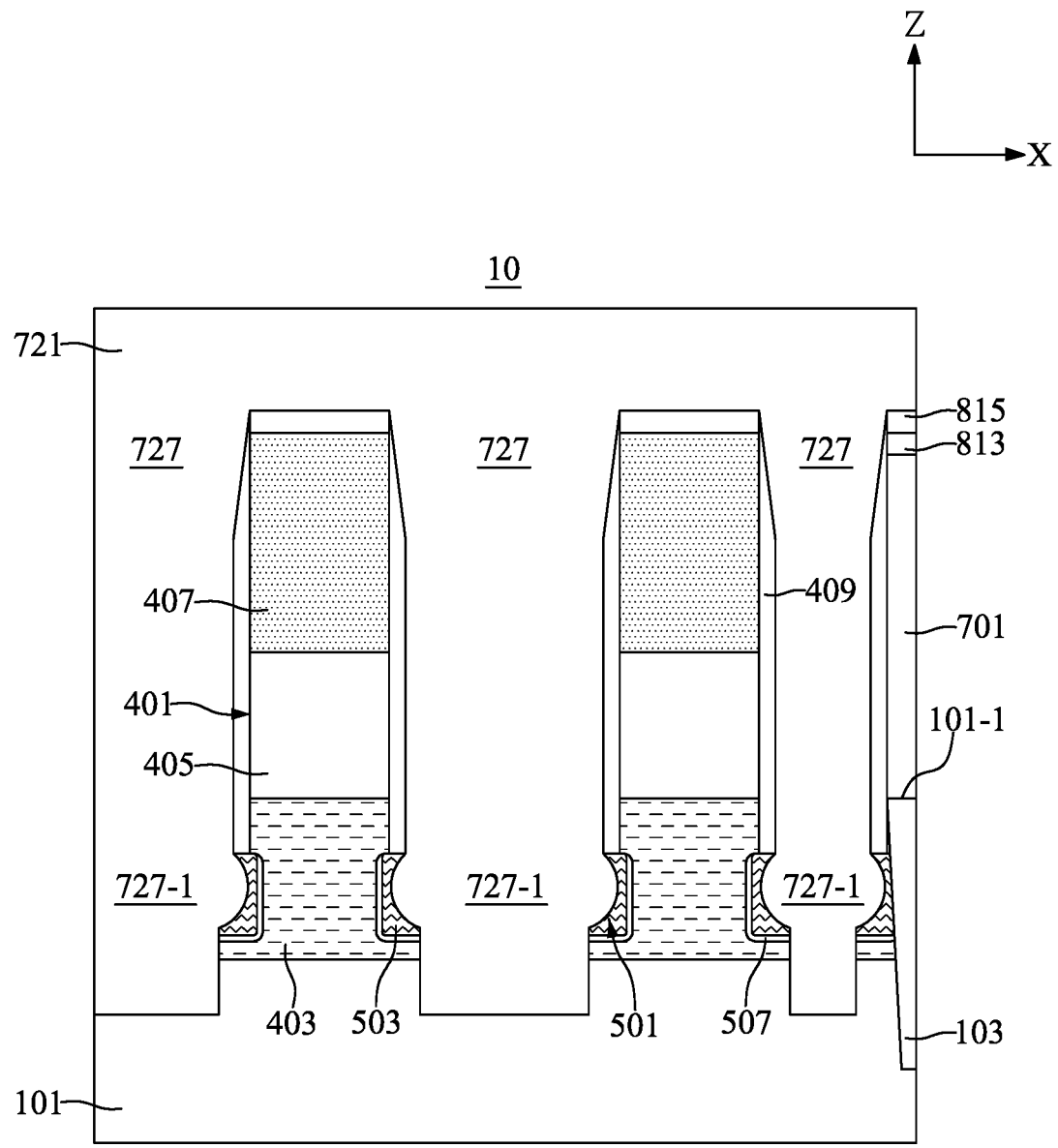
FIG. 32 is a schematic cross-sectional view diagram taken along the line B-B' in FIG. 26 illustrating part of the flow for fabricating the semiconductor device in accordance with one embodiment of the present disclosure.
Figure 33:
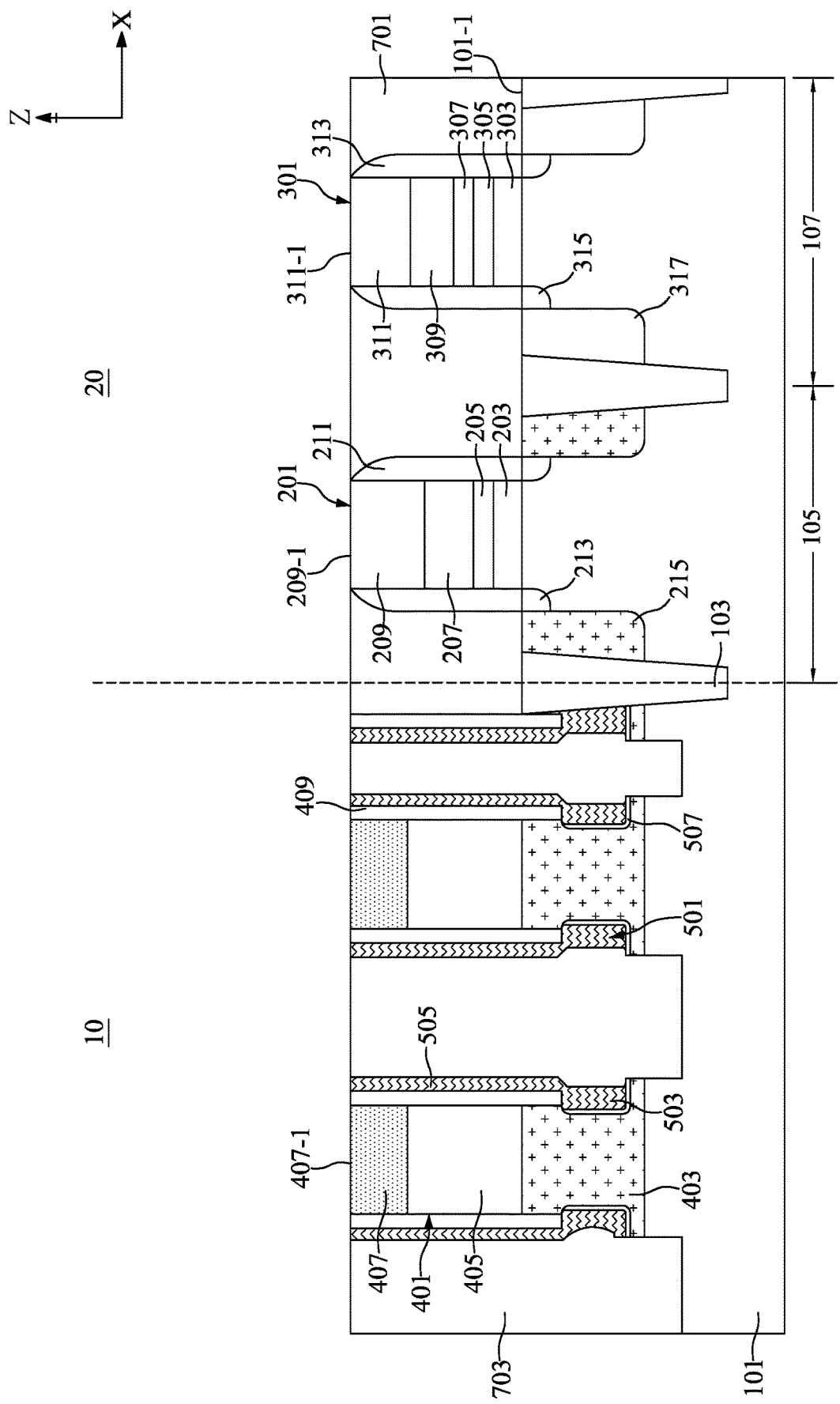
FIG. 33 is a schematic cross-sectional view diagram taken along the line A-A' in FIG. 26 illustrating part of the flow for fabricating the semiconductor device in accordance with one embodiment of the present disclosure.
Figure 34:
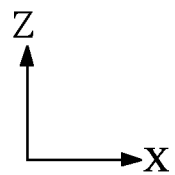
FIG. 34 is a schematic cross-sectional view diagram taken along the line B-B' in FIG. 26 illustrating part of the flow for fabricating the semiconductor device in accordance with one embodiment of the present disclosure.
Figure 34:
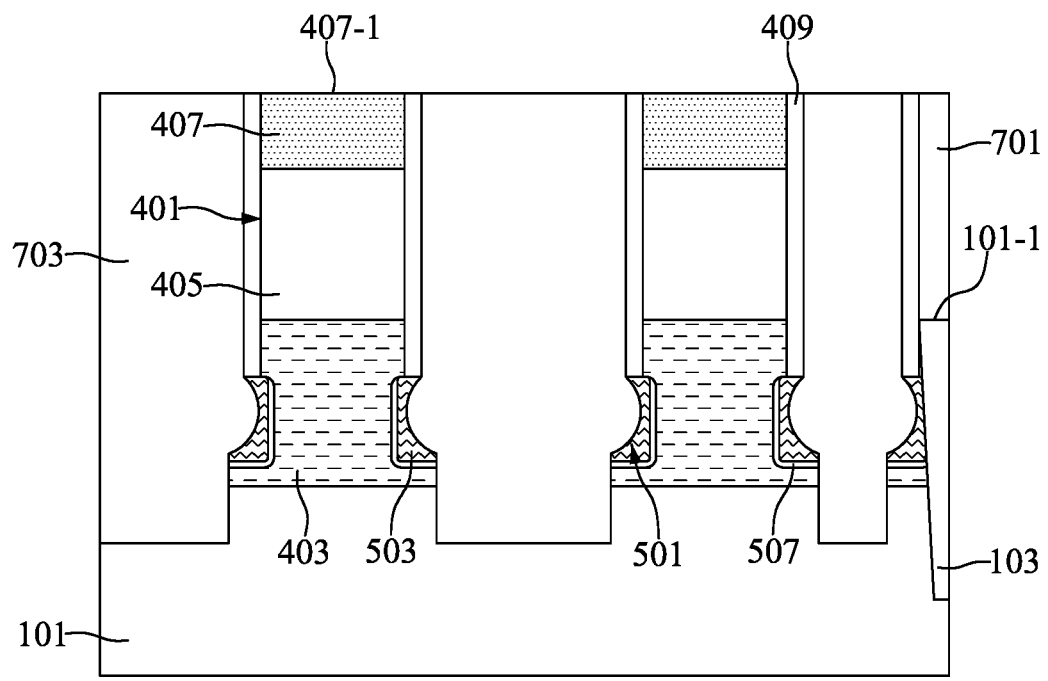

FIG. 31 is a schematic cross-sectional view diagram taken along the line A-A' in FIG. 26 illustrating part of the flow for fabricating the semiconductor device 100A in accordance with one embodiment of the present disclosure. FIG. 32 is a schematic cross-sectional view diagram taken along the line B-B' in FIG. 26 illustrating part of the flow for fabricating the semiconductor device 100A in accordance with one embodiment of the present disclosure. FIG. 33 is a schematic cross-sectional view diagram taken along the line A-A' in FIG. 26 illustrating part of the flow for fabricating the semiconductor device 100A in accordance with one embodiment of the present disclosure. FIG. 34 is a schematic cross-sectional view diagram taken along the line B-B' in FIG. 26 illustrating part of the flow for fabricating the semiconductor device 100A in accordance with one embodiment of the present disclosure.

With reference to FIGS. 31 and 32, a first insulating material 721 may be formed in the plurality of second trenches 727, in the recessed portions 727-1, and on the top surface of the second hard mask film 815. The first insulating material may be formed of a same material as the first insulating layer 701, but is not limited thereto. With reference to FIGS. 33 and 34, a planarization process, such as chemical mechanical polishing, may be performed until the top surface 209-1 of the first gate mask layer 209 and the top surface 311-1 of the second gate mask layer 311 are exposed. After the planarization process, the first insulating material 721 may be turned into the second insulating layer 703 and a substantially flat surface for subsequent processing steps may be formed. In the current stage, the top surface 407-1 of the top doped region 407 may be at a same vertical level as the top surface 209-1 of the first gate mask layer 209 and the top surface 311-1 of the second gate mask layer 311.

Figure 35:
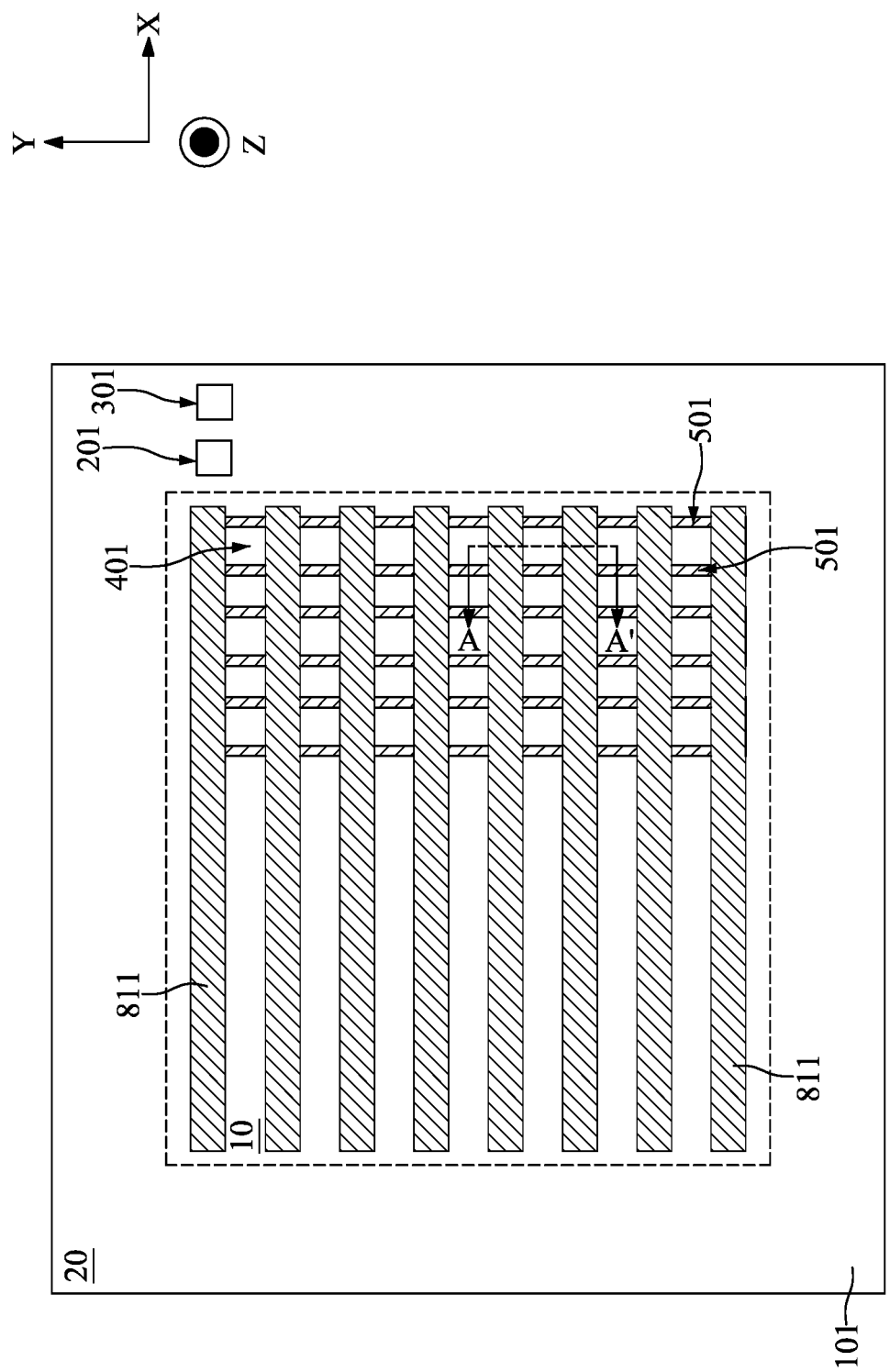
FIG. 35 illustrates, in a schematic top-view diagram, an intermediate semiconductor device in accordance with one embodiment of the present disclosure.
Figure 36:
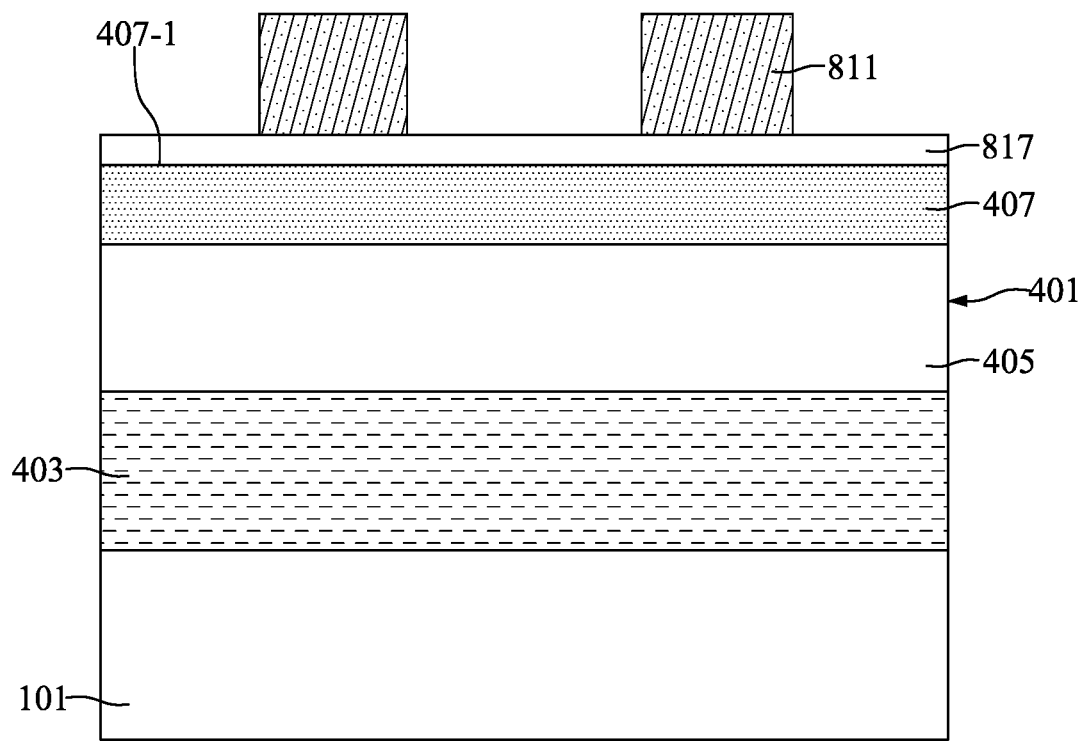
FIGS. 36 and 37 are schematic cross-sectional view diagrams taken along a line A-A' in FIG. 35 illustrating part of the flow for fabricating the semiconductor device in accordance with one embodiment of the present disclosure.
Figure 37:
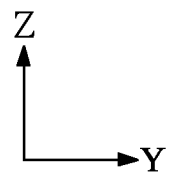
Figure 37:
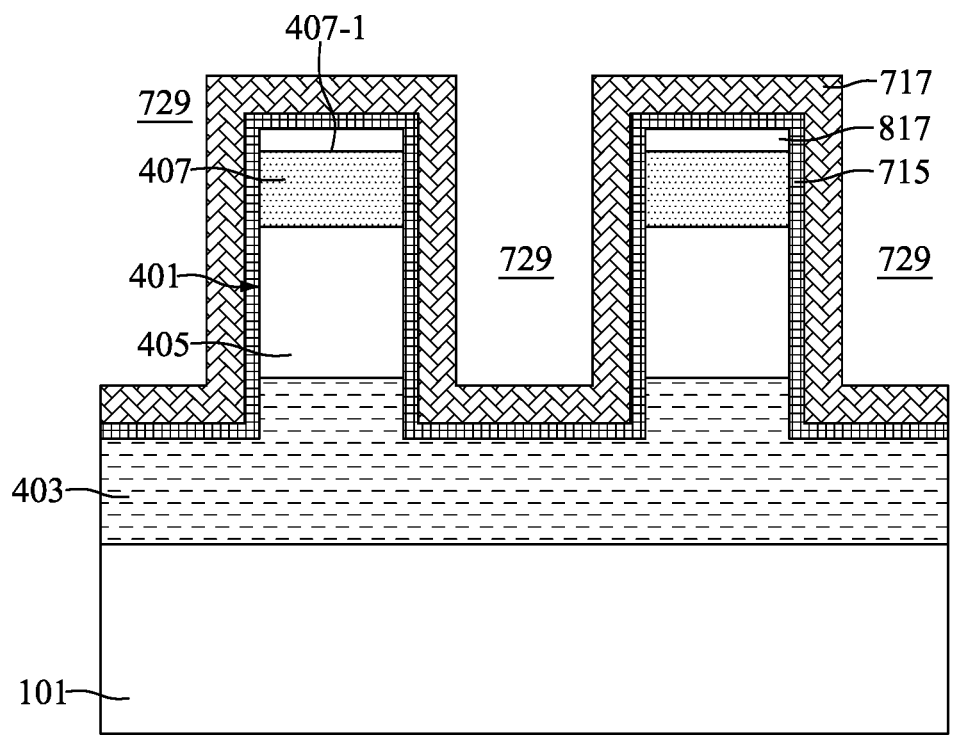

FIG. 35 illustrates, in a schematic top-view diagram, an intermediate semiconductor device in accordance with one embodiment of the present disclosure. FIGS. 36 and 37 are schematic cross-sectional view diagrams taken along a line A-A' in FIG. 35 illustrating part of the flow for fabricating the semiconductor device 100A in accordance with one embodiment of the present disclosure.

With reference to FIGS. 8 and 35 to 40, at step S19, in the embodiment depicted, a plurality of word lines 601 may be formed adjacent to the plurality of active columns 401. With reference to FIGS. 35 and 36, a third hard mask film 817 may be formed on the second insulating layer 703 and the top doped region 407. A sixth mask layer 811 may be patterned to define positions of a plurality of third trenches 729. The sixth mask layer 811 may comprise bars having a rectangular shape and extending in the X direction from a top-view perspective.

With reference to FIG. 37, an etch process, such as an anisotropic dry etch process, may be performed to form the plurality of third trenches 729 penetrating the third hard mask film 817, the top doped region 407, the channel region 405, and upper portions of the bottom doped region 403. In other words, bottoms of the plurality of third trenches 729 may be at a vertical level lower than a vertical level of the top surfaces of the bottom doped region 403. A word line insulating material 715 and a word line conductive material 717 may be sequentially formed in the plurality of third trenches 729. The word line insulating material 715 may be formed of, for example, an insulating material having a dielectric constant of about 4.0 or greater. The word line conductive material 717 may be formed of a conductive material such as polysilicon, silicon germanium, metal, metal alloy, metal silicide, metal nitride, or metal carbide.

Figure 38:
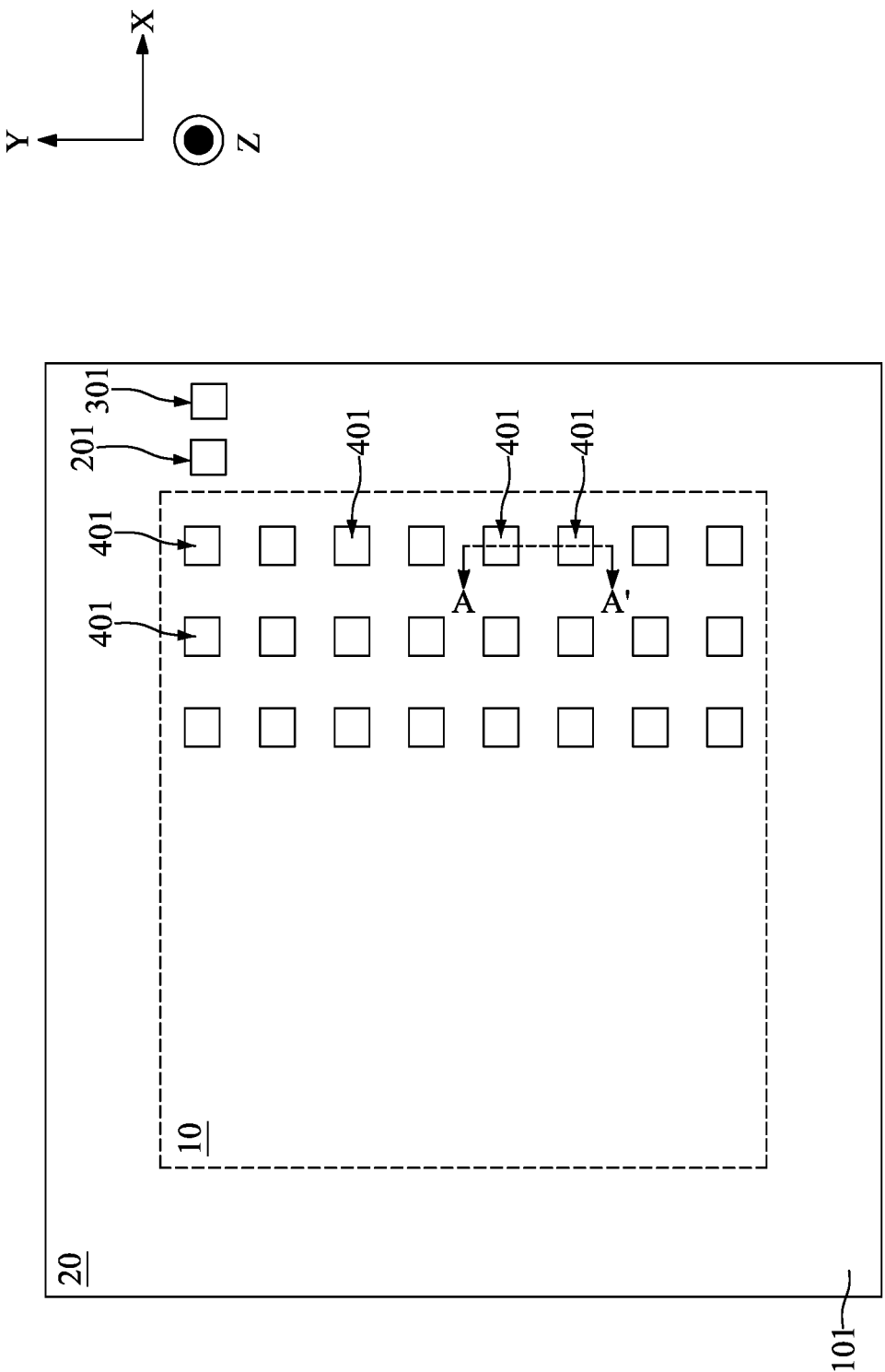
FIG. 38 illustrates, in a schematic top-view diagram, an intermediate semiconductor device in accordance with one embodiment of the present disclosure.
Figure 39:
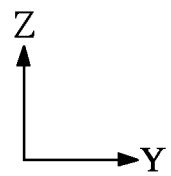
FIGS. 39 and 40 are schematic cross-sectional view diagrams taken along a line A-A' in FIG. 38 illustrating part of the flow for fabricating the semiconductor device in accordance with one embodiment of the present disclosure.
Figure 39:
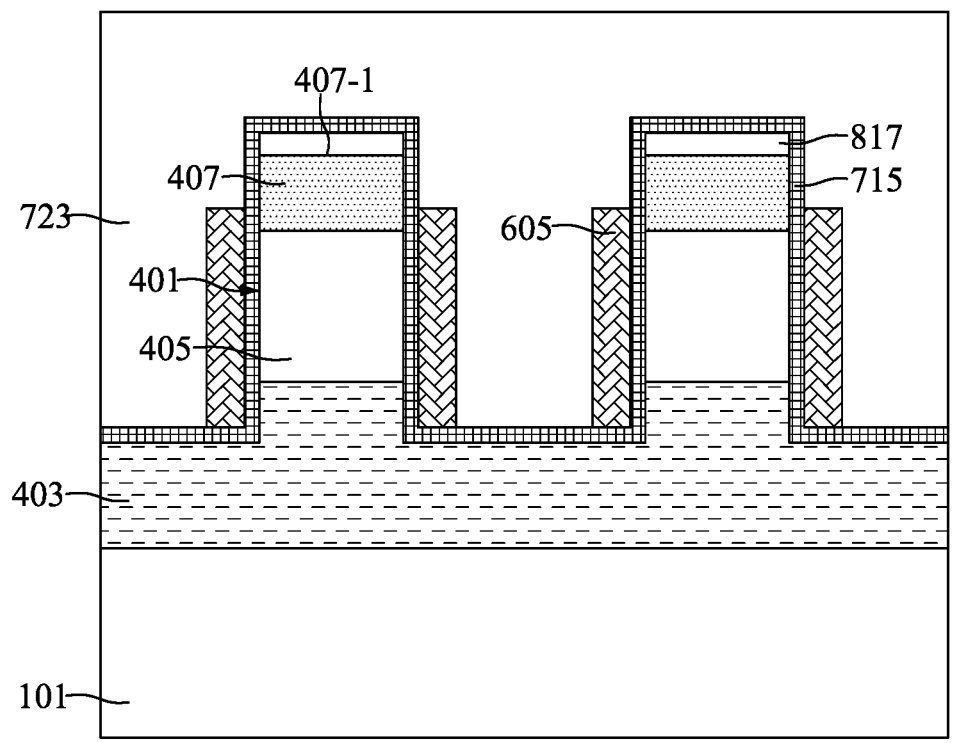
Figure 40:
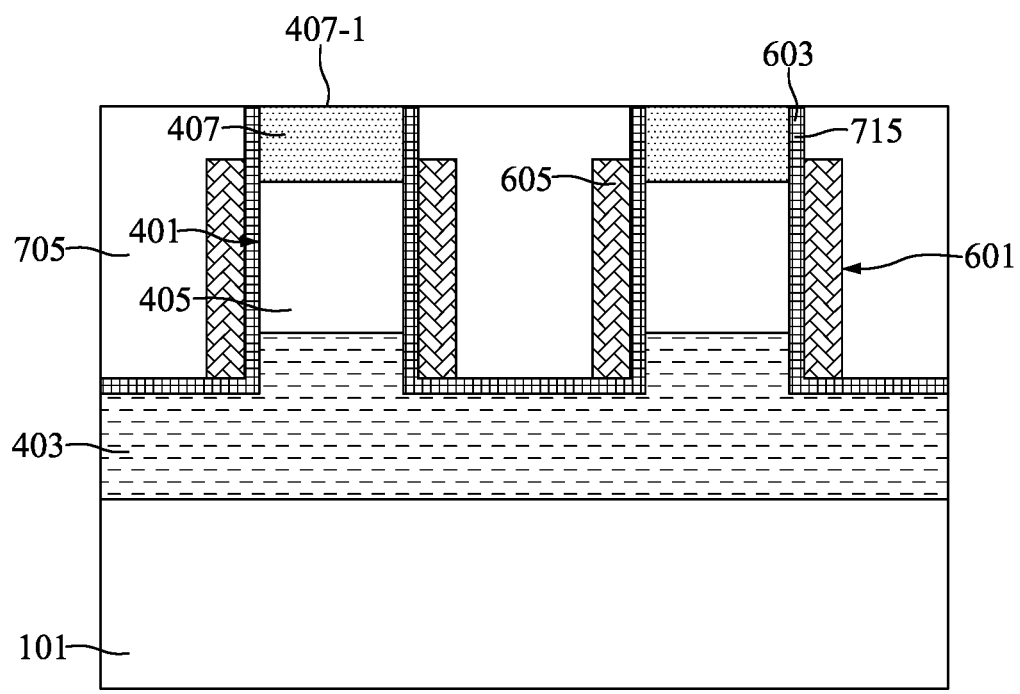

FIG. 38 illustrates, in a schematic top-view diagram, an intermediate semiconductor device in accordance with one embodiment of the present disclosure. FIGS. 39 and 40 are schematic cross-sectional view diagrams taken along a line A-A' in FIG. 38 illustrating part of the flow for fabricating the semiconductor device 100A in accordance with one embodiment of the present disclosure.

With reference to FIGS. 38 and 39, an etch process, such as an anisotropic dry etch process, may be performed to remove a portion of the word line conductive material 717 and turn the word line conductive material 717 into word line conductive layers 605. The word line conductive layers 605 may extend in the direction X. Top surfaces of the word line conductive layers 605 may be at a vertical level lower than the vertical level of the top surface 407-1 of the top doped region 407. Bottoms of the word line conductive layers 605 may be at a vertical level lower than the vertical level of the top surfaces of the bottom doped regions 403. Subsequently, a second insulating material 723 may be formed to cover the plurality of third trenches 729. The second insulating material 723 may be formed of a same material as the first insulating layer 701, but is not limited thereto.

With reference to FIG. 40, a planarization process, such as chemical mechanical polishing, may be performed until the top surface 407-1 of the top doped region 407 is exposed and a substantially flat surface for subsequent processing steps is formed. After the planarization process, the word line insulating material 715 may be turned into the word line insulating layer 603, and the second insulating material 723 may be turned into the third insulating layer 705. The third insulating layer 705 may be formed so as to extend in the direction X. The word line insulating layer 603 formed between adjacent active columns 401 may have a U-shaped profile from a cross-sectional perspective.

With reference back to FIGS. 1 to 4, at step S21, in the embodiment depicted, a plurality of bit line contacts 709 and a plurality of capacitor contacts 711 may be formed above the substrate 101. A fourth insulating layer 707 may be formed on the first insulating layer 701, the second insulating layer 703, the third insulating layer 705, and the plurality of active columns 401. The plurality of bit line contacts 709 may be respectively correspondingly formed on the extending portions 505 by a damascene process. The plurality of capacitor contacts 711 may be formed on the top doped region 407 by another damascene process.

Due to the design of the semiconductor device 100A of the present disclosure, the top surface 209-1 of the first gate mask layer 209, the top surface 311-1 of the second gate mask layer 311, the top surface 407-1 of the top doped region 407, the top surface of the first insulating layer 701, the top surface of the second insulating layer 703, and the top surface of the third insulating layer 705 may be at the same vertical level. In other words, top surfaces of the center area 10 and the peripheral area 20 may be at the same vertical level. The semiconductor device 100A may have a substantially flat top surface to facilitate performing of subsequent semiconductor processes on the substantially flat top surface. Therefore, the yield and quality of the semiconductor device may be improved. In addition, the presence of the plurality of air gaps 731 may significantly alleviate an interference effect originating from the parasitic capacitance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
providing a substrate comprising a center area and a peripheral area surrounding the center area;
forming a first gate stack in the peripheral area of the substrate, wherein the first gate stack comprises a first gate mask layer to form a top surface of the first gate stack;
forming an active column in the center area of the substrate, wherein the active column comprises a top doped region to form a top surface of the active column, wherein the top surface of the first gate stack and the top surface of the active column are at a same vertical level.

2. The method for fabricating a semiconductor device 1, wherein forming the active column comprises: forming a bottom doped region in the center area, and forming a channel region on the bottom doped region, wherein the top doped region is formed on the channel region, wherein a bottom of the channel region is formed at a same vertical level as a top surface of the substrate, and a top surface of the top doped region is formed at a same vertical level as the top surface of the first gate stack.

3. The method for fabricating a semiconductor device 2, further comprising: forming a bit line comprising a connection portion and an extending portion, wherein the connection portion extends in a first direction and is adjacent to a side, parallel to the first direction, of the bottom doped region, wherein the extending portion is connected to an end of the connection portion and extends in a second direction perpendicular to the first direction.

4. The method for fabricating a semiconductor device 3, wherein a top surface of the extending portion is at a same vertical level as the top surface of the first gate stack.

5. The method for fabricating a semiconductor device 4, further comprising: forming an insulating spacer between the extending portion and the active column.

6. The method for fabricating a semiconductor device 5, further comprising: forming an adhesion layer between the connection portion and the bottom doped region.

7. The method for fabricating a semiconductor device 6, further comprising: forming a word line comprising a word line insulating layer and a word line conductive layer both extending in a third direction perpendicular to the first direction and the second direction, wherein the word line insulating layer is attached to a side, which is parallel to the third direction, of the active column, and the word line conductive layer is attached to the word line insulating layer.

8. The method for fabricating a semiconductor device 7, wherein a bottom of the word line conductive layer is at a vertical level lower than the vertical level of the bottom of the channel region, and a top surface of the word line conductive layer is at a vertical level higher than a vertical level of a top surface of the channel region.

9. The method for fabricating a semiconductor device 8, further comprising: forming a first insulating layer on the center area and surrounding the first gate stack.

10. The method for fabricating a semiconductor device 9, further comprising: forming a second insulating layer arranged parallel to the first direction and adjacent to the plurality of bit lines, wherein a bottom of the second insulating layer is at a vertical level lower than a vertical level of the bottom of the bottom doped region.

11. The method for fabricating a semiconductor device 10, further comprising: forming a third insulating layer parallel to the third direction and adjacent to the word line conductive layer.

12. The method for fabricating a semiconductor device 11, further comprising: forming a bit line contact on the extending portion.

13. The method for fabricating a semiconductor device 12, further comprising: forming a capacitor contact on the top doped region.

14. The method for fabricating a semiconductor device 13, wherein the first gate stack comprises a first gate insulating layer on the peripheral area, a first gate bottom conductive layer on the first gate insulating layer, and a first gate filler layer on the first gate bottom conductive layer, wherein the first gate mask layer is positioned on the first gate filler layer, wherein a top surface of the first gate mask layer is at a same vertical level as the top surface of the top doped region.

15. The method for fabricating a semiconductor device 14, wherein the first gate insulating layer has a thickness between about 0.5 nm and about 5.0 nm.

16. The method for fabricating a semiconductor device 15, further comprising: forming a second gate stack on the peripheral area of the substrate, wherein a top surface of the second gate stack is at a same vertical level as the top surface of the first gate mask layer.

17. The method for fabricating a semiconductor device 16, wherein the second gate stack comprises a second gate insulating layer on the peripheral area, a second gate bottom conductive layer on the second gate insulating layer, a second gate top conductive layer on the second gate bottom conductive layer, a second gate filler layer on the second gate top conductive layer, and a second gate mask layer on the second gate filler layer, wherein a top surface of the second gate mask layer is at a same vertical level as the top surface of the top doped region.

18. The method for fabricating a semiconductor device 17, wherein the thickness of the first gate insulating layer is different from a thickness of the second gate insulating layer.

19. The method for fabricating a semiconductor device 17, wherein the first gate bottom conductive layer has a thickness between about 10 angstroms and about 200 angstroms, and the first gate bottom conductive layer is formed of aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride.

* * * * *